United States Patent
Sakamoto et al.

(10) Patent No.: US 6,528,879 B2
(45) Date of Patent: Mar. 4, 2003

(54) SEMICONDUCTOR DEVICE AND SEMICONDUCTOR MODULE

(75) Inventors: Noriaki Sakamoto, Gunma (JP); Yoshiyuki Kobayashi, Gunma (JP); Junji Sakamoto, Gunma (JP); Shigeaki Mashimo, Gunma (JP); Katsumi Okawa, Gunma (JP); Eiju Maehara, Gunma (JP); Kouji Takahashi, Gunma (JP)

(73) Assignee: Sanyo Electric Co., Ltd. (JP)

( * ) Notice: Subject to any disclaimer, the term of this patent is extended or adjusted under 35 U.S.C. 154(b) by 118 days.

(21) Appl. No.: 09/824,486

(22) Filed: Mar. 29, 2001

(65) Prior Publication Data

US 2002/0033530 A1 Mar. 21, 2002

(30) Foreign Application Priority Data

Sep. 20, 2000 (JP) ........................................ 2000-285562

(51) Int. Cl.$^7$ .................... H01L 23/06; H01L 23/48; H01L 23/28
(52) U.S. Cl. ................ 257/729; 257/738; 257/784; 257/787
(58) Field of Search ................ 257/729, 737, 257/738, 741, 747, 748, 690, 762, 769, 782, 784, 787; 438/112, 127, 650, 687, 686

(56) References Cited

U.S. PATENT DOCUMENTS

| | | | | |
|---|---|---|---|---|
| 5,045,408 A | * | 9/1991 | Williams et al. | 257/734 |
| 5,200,362 A | | 4/1993 | Lin et al. | 438/126 |
| 5,736,789 A | * | 4/1998 | Moscicki | 257/774 |
| 5,841,192 A | * | 11/1998 | Exposito | 257/701 |
| 5,976,912 A | | 11/1999 | Fukutomi et al. | 438/110 |
| 6,001,671 A | | 12/1999 | Fjelstad | 438/112 |

FOREIGN PATENT DOCUMENTS

| | | | | |
|---|---|---|---|---|
| JP | 59-208756 | | 11/1984 | H01L/23/12 |
| JP | 2-96374 | * | 4/1990 | |
| JP | 2-240940 | | 9/1990 | H01L/21/56 |
| JP | 3-94430 | | 4/1991 | H01L/21/50 |
| JP | 3-94431 | | 4/1991 | H01L/21/50 |

* cited by examiner

Primary Examiner—Tom Thomas
Assistant Examiner—Hung Kim Vu
(74) Attorney, Agent, or Firm—Fish & Richardson PC

(57) ABSTRACT

A semiconductor device is provided wherein conductive paths 40, formed of crystal that grows better along the X-Y axis than along the Z axis, are embedded in an insulating resin 44, and the back surface of the conductive path 40 is exposed through the insulating resin 44 and sealed. With this arrangement, fractures of the conductive paths 40 embedded in the insulating resin 44 are suppressed.

24 Claims, 26 Drawing Sheets

FIG.2A

Bending-characteristic Test of Conductive foil

| | Curvature Radius(mm) | 0.99 | | 3.18 | |
|---|---|---|---|---|---|
| | Direction | Rolling Direction | Widthwise Direction | Rolling Direction | Widthwise Direction |
| Rolling Anneal | Distortion(%) | 3.84 | | 1.21 | |
| | Times of Fractures | 375 | 314 | 4393 | 3948 |
| | Fatigue Ductility(%) | 123.8 | 105.3 | 147.9 | 140.4 |
| Rolling Azroll | Distortion(%) | 3.77 | | 1.19 | |
| | Times of Fractures | 422 | 206 | 4750 | 2810 |
| | Fatigue Ductility(%) | 132.3 | 76.7 | 141.6 | 104 |
| Electrolytic Foil | Distortion(%) | 3.26 | | 1.03 | |
| | Times of Fractures | 100 | 67 | 2050 | 1144 |
| | Fatigue Ductility(%) | 29.3 | 21.3 | 33.2 | 20.4 |

Impurity of Rolled Cu foil    Unit : wt%

|    | Rolling Cupper foil A | Rolling Cupper foil B | Rolling Cupper foil C |
|----|-----------------------|-----------------------|-----------------------|
| Ni | 3.2                   |                       |                       |
| Si | 0.7                   |                       |                       |
| Zn | 0.3                   | 0.2                   | 0.1                   |
| Sn | 1.25                  | 0.25                  |                       |
| Cr |                       | 0.3                   |                       |
| Fe |                       |                       | 2.3                   |
| P  |                       |                       | 0.03                  |

FIG.22　Example: Differential Current Mirror Circuit
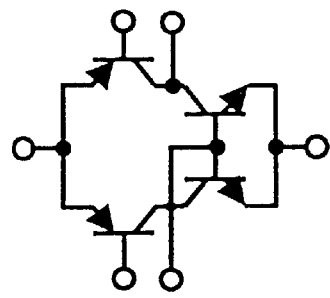
Single SMD
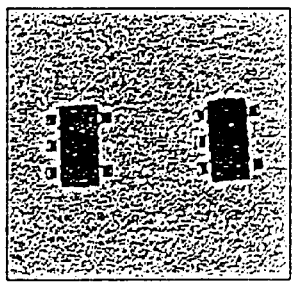
Complexed SMD
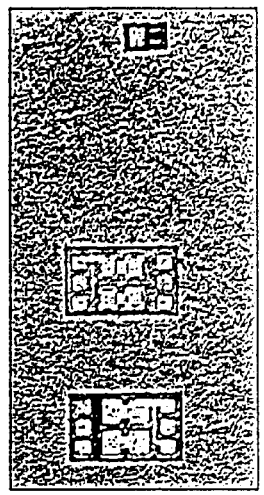
Semiconductor Device of this Invention
Equivalent Circuit
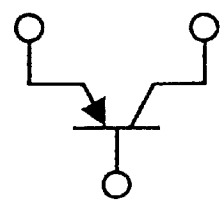
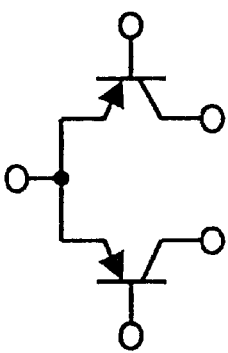
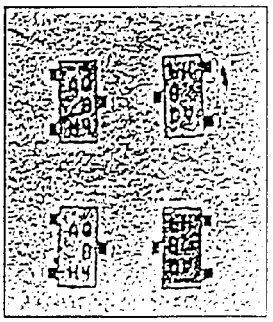

SEMICONDUCTOR DEVICE AND SEMICONDUCTOR MODULE

BACKGROUND OF THE INVENTION

1. Field of the Invention

The present invention relates to a semiconductor device and a semiconductor module, and relates in particular to a technique for preventing a defect due to the mismatching of thermal expansion coefficients when a semiconductor device is mounted on a substrate.

2. Description of the Related Art

To produce a hybrid integrated circuit for installation in an electronic apparatus, a conductive pattern is formed on a printed circuit board, a ceramic substrate or a metal substrate, and an active element, such as an LSI or a discrete TR, and a passive element, such as a chip capacitor, a chip resistor or a coil, are mounted thereon. The conductive pattern and these elements are electrically connected to provide a circuit capable of performing a predetermined function.

FIG. 24 is a diagram of such a circuit, an audio circuit, the elements of which are mounted as shown in FIG. 25.

In FIG. 25, straight, peripheral lines describe a rectangular substrate 1 having a surface that is, at the least, insulated. Adhered thereto is a conductive pattern 2, composed of Cu. The conductive pattern 2 is composed of an external connecting electrode 2A, a wire line 2B, a die pad 2C, a bonding pad 2D, and an electrode 4, fixed to the passive element 3.

A bare chip, consisting of a TR, a diode, a composite element or an LSI, is soldered to the die pad 2C, and the electrode on the chip and the bonding pad 2D are electrically connected by fine metal lines 5A, 5B and 5C, each of which is generally divided into a low signal portion and a high signal portion. An Au or Al line 5A of about 40 $\mu$m $\phi$ is employed for the low signal portion, and an Au or Al line of about 100 to 300 $\mu$m $\phi$ is employed for the high signal portion. Especially, since the high signal portion has a large diameter, while taking manufacturing costs into account, an Al line 5B of 150 $\mu$m $\phi$ and an Al line 5C of 300 $\mu$m $\phi$ are employed.

A power TR 6 though which a large current flows is securely fixed to a heat sink 7 on a die pad 2C in order to prevent a rise in the temperature of the chip.

The line 2B is extended to various locations in order to form the circuit for the external drawing electrode 2A, the die pad 2C, the bonding pad 2D and the electrode 4. Further, when lines intersect each other because of their disposition on the chip and when they must be extended, jumper lines 8A and 8B are employed.

An example semiconductor device to be mounted in the substrate 1 is a semiconductor device packaged using an insulating resin. As such a packaged semiconductor device there is a lead frame type semiconductor device, wherein a semiconductor chip is mounted in a lead frame and the resultant structure is packaged using an insulating resin; a support substrate type semiconductor device, wherein a semiconductor chip is mounted on a ceramic support substrate, a printed circuit board or a flexible sheet, and the resultant structure is packaged using an insulating resin; or a plated type semiconductor device, wherein a semiconductor chip is mounted on a plated electrode and the resultant structure is packaged. It should be noted that the plated type semiconductor device is described in detail in JP-A-3-94431.

FIG. 26A is a schematic diagram showing the plated type semiconductor device. Conductive paths 10A to 10D are formed of a plated film, a semiconductor chip 11 is securely bonded to the die pad 10A, and the bonding pad on the semiconductor chip 11 and the plated bonding pad 10B are electrically connected by a fine metal line 12. A passive element 13 is bonded between the electrodes 10C and 10D via a brazing material. And since the plated film is embedded in the insulating resin without using a support substrate, a thin semiconductor device can be provided.

As is described above, a semiconductor device packaged using various methods is mounted on the substrate 1. However, when a lead frame type semiconductor device is packaged, since lead projects outward from the package, the area of the substrate occupied by the device is expanded, and the size of the substrate must accordingly be increased. In addition, the lead frame could be cut or a burr could be left on the lead. Furthermore, for the support substrate type semiconductor device, since a support substrate is employed, the semiconductor device will be thicker, and accordingly, the weight of the device will be increased. Further, although a thin and compact plated type semiconductor device can be made because no support substrate is employed and because no lead projects outward from the package, the following problem has arisen.

For the explanation of the problem, in FIG. 26B an enlarged diagram is shown of a portion enclosed by a broken-line circle in FIG. 26A. Included in this portion is a conductive path 10B, which is formed by plating and is represented as a set of trigonal pyramids; solder 17; a substrate 15; and a conductive pattern 16 adhered to the substrate 15.

The plated film is generally deposited by electrolytic plating, and has a crystal structure that assumes a tapered pillar shape. This structure is represented by using the trigonal pyramids. Since when formed the plated film is thin and has a polycrystalline structure, it is mechanically weak, and cracks tend to occur due to differences in the thermal expansion coefficient of the insulating resin. In addition, the grain boundary easily diffuses an externally supplied material. Thus as one problem, the flux used for soldering or an external ambient gas, such as moisture, may enter via the connection for the fine metal line 12, and at the grain boundary, cause deterioration of the connection strength. Further, as another problem, when an electrode 10B is formed using Cu plating, the solder layer underneath is diffused and eats into the plated film, thereby deteriorating the strength of the connection with the fine metal line.

In addition, when an elongated plated film is formed as a wire line, line disconnection may occur due to mismatching with the thermal expansion coefficient of the insulating resin. Similarly, when the plating type semiconductor device is mounted in the substrate, cracks also occur in wire lines due to mismatching with the thermal expansion coefficient of the substrate, and causes line disconnections or increases in line resistance. Especially when a long wire line is formed using the plated electrode 10B, stress is generated in proportion to the length. Therefore, differences in the thermal expansion coefficient of the insulating resin 14 or the substrate 15 aggravates defects in the plated film and degrades reliability even more.

SUMMARY OF THE INVENTION

To resolve these shortcomings, according to a first aspect of the invention, a semiconductor device comprises:

a plurality of conductive paths formed of a conductive material whose crystal growth is large in the X and Y directions;

a semiconductor chip electrically connected to the conductive paths; and an insulating resin which is coated on the semiconductor chip and fills separation grooves between the conductive paths, thereby integrally supporting the conductive paths while the back surfaces of the conductive paths are exposed.

As is shown in FIG. 1A, a film that experiences more growth along the Z axis than along the X-Y axis is called a Z film, and a film that experiences more growth along the X-Y axis than along the Z axis is called an X-Y film. The Z film may be a plated film grown using an electrolytic process or an electroless process, and the X-Y film is a film, such as rolled copper foil, formed by rolling.

As is shown in the cross section of the X-Y film in FIG. 1C, since the individual crystals are laminated, spreading along the X-Y axis, the area size of the grain boundary is smaller than the Z film in FIG. 1A. Therefore, the phenomenon of diffusion or transmission through the grain boundary is considerably restricted. The Z film in FIG. 1B is so structured that it is very weak and is susceptible to the stress produced when the structure is bent and extended horizontally by an external force. Further, as is shown in FIG. 1C, the X-Y film is more resistant to warping and tearing than is the Z film. Therefore, the occurrence of cracks in a conductive path because of differences in the thermal expansion coefficients of the insulating resin that seals the conductive path can be prevented. Further, since the crystal size is large, the overall resistance of the conductive paths can also be reduced. Especially when the conductive paths are to be embedded in a package having a thickness of 0.5 mm or less, since the plane size is greater than the thickness, stress is exerted in the X-Y direction due to differences in the thermal expansion coefficients of the conductive path and the insulating resin. However, since each crystal experiences extensive growth in the X-Y direction, greater structural resistance to stress can be obtained.

When an electrode composed of rolled copper foil that is embedded in insulating resin is compared with a copper plated electrode that is likewise embedded, the rolled copper foil electrode is superior in strength and can better resist stress, and at the contact portion is also less contaminated due to diffusion.

According to a second aspect, the back surface of the insulating resin and the side walls of the conductive paths are substantially on the same etching plane.

As is obvious when considering a manufacturing method that will be described later, since these faces are half-etched and the insulating resin is later embedded therein, the insulating resin assumes the shape of the curved structure obtained by half-etching. This structure not only provides anchoring effects, but also reduces contact resistance on the back surface. Therefore, the movement and the self-alignment of the semiconductor device are facilitated.

According to a third aspect of the invention, the back surfaces of the conductive paths are formed so that they are recessed more than are the back surfaces of the separation grooves.

Since the conductive paths are recessed, a thick soldered portion can be formed on the conductive paths, and since the convex portion of the insulating resin is formed, the adjacent soldered portions do not contact each other.

According to a fourth aspect of the invention, an oxide of the conductive material is deposited on the upper surfaces of the conductive paths that contact the insulating resin.

Since a copper oxide is deposited on the upper surface of each conductive path, especially the surface of a metal that contains copper as the main material, the conductive paths can be more closely attached to the insulating resin.

According to a fifth aspect of the invention, the insulating film is substantially thinner than 1 mm, and the conductive paths are thick enough that they can be processed using the rolling method.

According to a sixth aspect, a semiconductor device comprises:

a plurality of conductive paths formed of crystal that grows better along the X and Y axes than along the Z axis;

a conductive film deposited on the upper faces of the conductive paths that is formed mainly of crystal and that grows better along the Z axis than along the X and Y axes;

a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed.

In principle, when the conductive patterns that serve as electrodes and wire lines are formed of the X-Y film, and the Z film is grown only on the portion whereat an electrical connection is required, a superior characteristic can be obtained compared with when all the conductive patterns are formed of the Z film. Thus, a semiconductor device is resistant to line disconnection or contamination at a joint.

According to a seventh aspect of the invention, a semiconductor device comprises:

a plurality of conductive paths formed of crystal that grows better along the X and Y axes than along the Z axis;

a conductive film deposited on the upper faces of the conductive paths and formed mainly of crystal that grows better along the Z axis than along the X and Y axes;

a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed.

wherein the back surface of the insulating resin and the side walls of the conductive paths are substantially on the same etching plane.

According to an eighth aspect of the invention, a semiconductor device comprises:

a plurality of conductive paths formed of crystal that grows better along the X and Y axes than along the Z axis;

a conductive film, deposited on the upper faces of the conductive paths, for which, because of plating, crystal growth is greater mainly along the Z axis a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed, wherein the etched side walls of the conductive paths are curved, and the curve formed in the etched side walls continues across at least a part of the back surface of the insulating resin.

According to a ninth aspect of the invention, non-anisotropic etching is used to form in the etched side walls the curve that is continued.

According to a tenth aspect of the invention, the back surfaces of the conductive paths are recessed more than is the back surface of the insulating resin.

According to an eleventh aspect of the invention, an oxide is deposited on the upper surfaces of the conductive paths contacting the insulating resin.

According to a twelfth aspect of the invention, a conductive film is deposited on the back surfaces of the conductive paths.

When the back surface of a conductive path is coated with metal film or soft solder, oxidization of the conductive path can be prevented. Therefore, even when the circuit pattern on the substrate is connected to a conductive path by brazing material, the chance of a connection failure can be considerably reduced because no oxide film is deposited on the conductive path.

According to a thirteenth aspect of the invention, the conductive film can be provided by forming eaves on the upper surfaces of the conductive paths.

Since the conductive paths and the conductive film, or the conductive paths themselves can implement the processing for the shaping of the eaves, anchoring effects can be obtained, and the slipping or the peeling of the conductive path can be prevented.

According to a fourteenth aspect of the invention, the conductive paths that are exposed and free of the insulating resin are covered by an insulating film, except for portions at electrical connections.

When conductive paths having various shapes are employed, the wetting of brazing material, such as solder, may occur across the entire area. Therefore, not only the volume but also the thickness of soft solder differs, depending on the size, the surface tension and the weight of the solder itself. And thus, when a film that is resistant to the wetting to which solder is susceptible is deposited on exposed conductive paths, the area whereat wetting of the solder occurs is reduced, and solder having a desired thickness can be formed on the back surfaces of the conductive paths.

According to a fifteenth aspect of the invention, wire lines are provided as the conductive paths, and the conductive paths that are exposed and free of the insulating resin are covered by an insulating film, except for portions at electrical connections.

The semiconductor device is so designed that the back surfaces of the conductive paths are exposed and free of the insulating resin. Thus, the back surfaces of lines shown in FIGS. 6, 7 and 11 are also exposed and extended long distances. Therefore, when the semiconductor device is mounted in a substrate, the lines and the conductive pattern in the substrate short-circuit. This short-circuiting is prevented, however, by depositing the insulating film that covers the back surfaces of the lines.

According to a sixteenth aspect of the invention, a semiconductor device comprises:

a plurality of conductive paths composed of a conductive material whose crystal growth is greater along the X and Y axes than along the Z axis;

a conductive film deposited on the upper faces of the conductive paths and formed mainly by the growth of crystal along the Z axis;

a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed, wherein the semiconductor device is mounted in the substrate via an exposed portion.

According to a seventeenth aspect of the invention, a semiconductor device comprises:

a plurality of conductive paths formed of a conductive material whose crystal growth is greater along the X and Y axes than along the Z axis;

a conductive film deposited on the upper faces of the conductive paths and formed mainly by the growth of crystal along the Z axis;

a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed, wherein the back surface of the insulating resin and the side walls of the conductive paths substantially for a continuous curve, and wherein the semiconductor device is mounted in the substrate via an exposed portion.

According to an eighteenth aspect of the invention, a semiconductor device comprises:

a plurality of conductive paths formed of a conductive material whose crystal growth is greater along the X and Y axes than along the Z axis;

a conductive film, deposited on the upper faces of the conductive paths, for which crystal growth, mainly because of plating, is greater along the Z axis;

a semiconductor chip electrically connected to the conductive paths; and an insulating resin that is coated on the semiconductor chip and that fills separation grooves between the conductive paths, so that the conductive paths are integrally supported while the back surfaces of the conductive paths are exposed, wherein the etched side walls of the conductive paths are curved, and at least one part of the shape of the back surface of the insulating resin substantially matches the etched side walls, and wherein the semiconductor device is mounted in the substrate via an exposed portion.

According to a nineteenth aspect of the invention, the back surfaces of the conductive paths and the substrate are connected using brazing material, and a film for preventing the leakage of the brazing material is deposited on a connection pattern on the back surfaces of the conductive paths and/or on the substrate.

When a plurality of differently sized conductive paths is employed, the brazing material spreads so as to wet all the conductive paths, so that the thickness of the brazing material formed on the back surface of the semiconductor device varies. The same phenomenon occurs for the conductive pattern on the substrate, and due to this phenomenon, the gaps between the substrate and the conductive paths are narrowed. However, when a film resistant to the wetting to which the brazing material is susceptible is, at the least, deposited either on the substrate or on the conductive paths, a constant gap can be maintained between them.

According to a twentieth aspect of the invention, the etched face is curved substantially the same as is a face formed by non-anisotropic etching.

According to a twenty-first aspect of the invention, the back surfaces of the conductive paths are recessed more than is the back surface of the insulating resin.

According to a twenty-second aspect of the invention, an oxide is deposited on the upper surfaces of the conductive paths contacting the insulating resin.

According to a twenty-third aspect of the invention, a conductive film is deposited on the back surfaces of the conductive paths.

According to a twenty-fourth aspect of the invention, the conductive film forms an eave on the upper surfaces of the conductive paths.

BRIEF DESCRIPTION OF THE DRAWINGS

FIG. 22 is a diagram for explaining the size of the semiconductor device of the invention.

DESCRIPTION OF THE PREFERRED EMBODIMENTS

First Embodiment for Explaining an X-Y Film

First, the size of a semiconductor device according to the invention will be explained while referring to FIGS. 5A to 5G. Since a TR chip is employed as a semiconductor chip 30, the plane of the chip 30 is approximately 0.55×0.55 mm while its thickness is 0.24 mm, and the size of the plane of a semiconductor device 31 is 1.6×2.3 mm while its thickness is 0.5 mm. When the plane size of the semiconductor device is two times or more that of the chip, and the thickness of the package is two times or less that of the chip, a thin semiconductor device can be obtained, especially when the package is mounted face down and metal lines are not extended across the top. That is, while the semiconductor device is thin, the plane can vary in size from around 1 mm×2 mm to far greater, depending on the combination of a semiconductor element and a passive element that will be described later.

As will be described later and as is apparent while collectively taking FIGS. 6B, 7, 10 and 11 into account, the semiconductor device of this invention can vary from a discrete package to a package constituting a circuit or a system, and can also be thin.

Conductive paths 32 to 34 are exposed on one face of the semiconductor device, and an insulating resin 35 is deposited extending from the conductive paths 32 to 34 toward the other face. Therefore, the contraction ratio for the insulating resin 35 is greater than the ratio for the conductive paths 32 to 34, and the entire structure tends to warp. Thus, conductive paths 32 to 34 that are resistant to stress are required. And since the wiring lines are longer, this problem is even more important.

Furthermore, the conductive paths 32 to 34 must be employed while taking into account not only a rise in manufacturing costs for the semiconductor device, but also the possibility an impurity or a gas will be diffused via the interface at the grain boundary, and that electrical joints will be deteriorated when thin, around 30 to 50 μm, conductive paths 32 to 34 are formed. Also, when a power semiconductor element is mounted, it is preferable that conductive path thicknesses range from 10 to 200 μm, while taking into account current volume and generated heat.

Figure 1A:
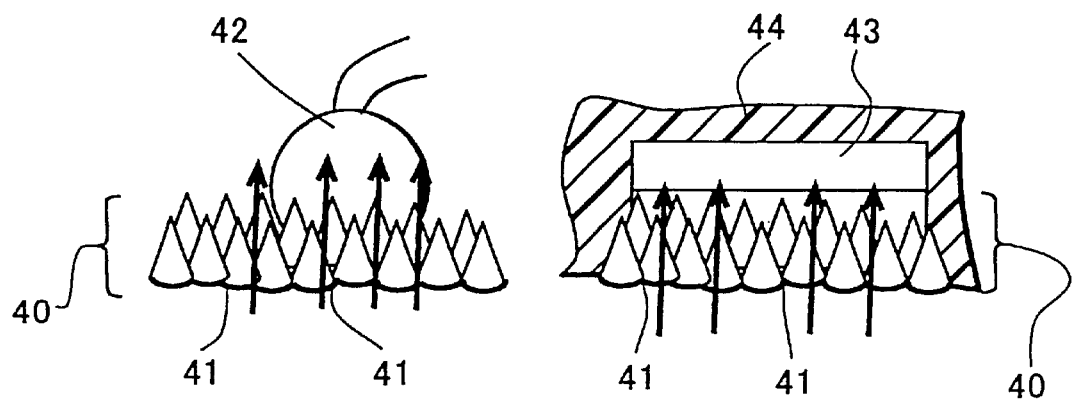
FIG. 1 is a diagram for explaining an X-Y film used for a semiconductor device according to the invention.

Generally, two types of electrode material are used: Z film in FIG. 1A and X-Y film in FIG. 1C. As was explained in the section "Problems that the Invention is to Solve", multiple interfaces are present on the back surface of a conductive path 40 formed of Z film, and as is indicated by arrows, at a grain boundary 41 a contaminant can easily enter from the outside and be diffused throughout a structure. An example contaminant is an external atmospheric gas, such as moisture. The flux used when brazing material is employed can constitute another contaminant that will deteriorate the bonding force of a fine metal line 42 that is fixed to the Z film, and that can also deteriorate the bonding force with which a chip 43 is die-bonded to the Z film.

Figure 1B:
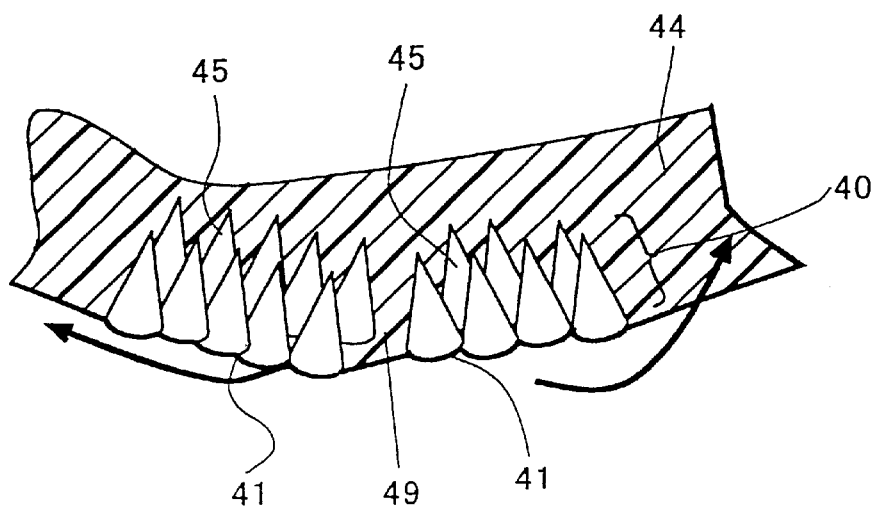

In addition, as is shown in FIG. 1B, since a fracture 49 can occur in the Z film 40 due to the warping that results from the contraction of the insulating resin 44, or since even when a fracture 49 does not occur, warping can cause the interval between the crystal grains to be extended, resistance is increased. In order to prevent this, either a thick Z film 40 must be formed, or multiple Z films 40 must be laminated. However, this would extend the film deposition time and would increase manufacturing costs.

Figure 1C:
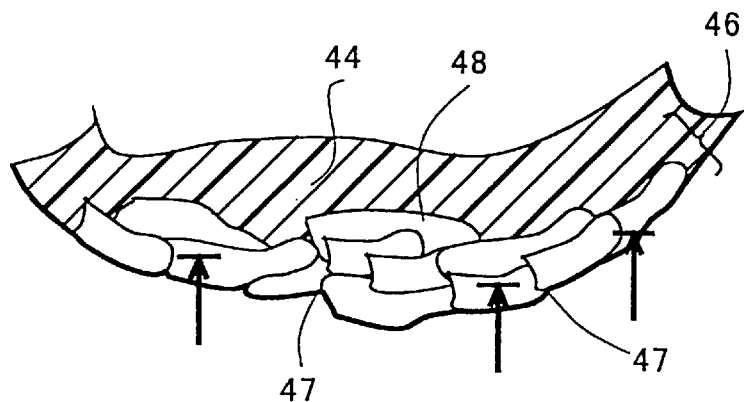

As is shown in FIG. 1C, the area wherein the interface is exposed to the back surface of a conductive path 46 formed of an X-Y film is smaller than the area associated with the Z film 40. Further, since there is extensive crystal growth in the X-Y direction and multiple layers of crystal grains 48 are laminated, as is indicated by arrows, the diffusion of a contaminant that enters via a grain boundary 47 can be prevented. This means that contamination of the surface of a conductive path 46 that occurs due to diffusion can be greatly limited.

Furthermore, fractures seldom occur in the X-Y film 46, even though warping may occur due to the contraction of the insulating resin 44, and resistance is also reduced. Copper foil of rolled metal can be employed as the X-Y film.

Figure 2B:
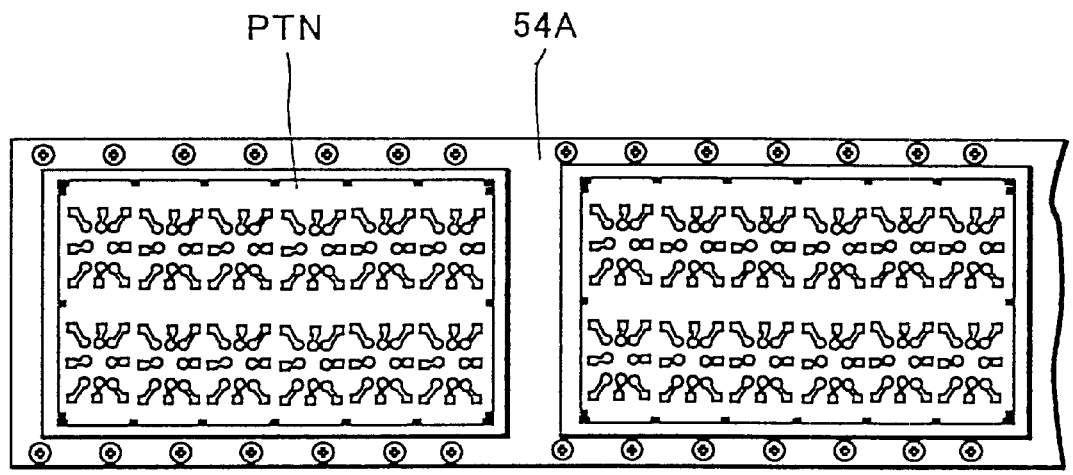
FIG. 2 is a diagram for explaining the characteristic of the X-Y film in FIG. 1.

FIGS. 2A and 2B are diagrams showing the characteristics of rolled conductive foil (X-Y film) composed of Cu and of electrolytic foil (Z film) obtained during the electrolytic process. As is apparent from FIG. 2A, both copper foil annealed after rolling and copper foil processed only by rolling are more resistant to fractures than is electrolytic foil.

Figure 1D:
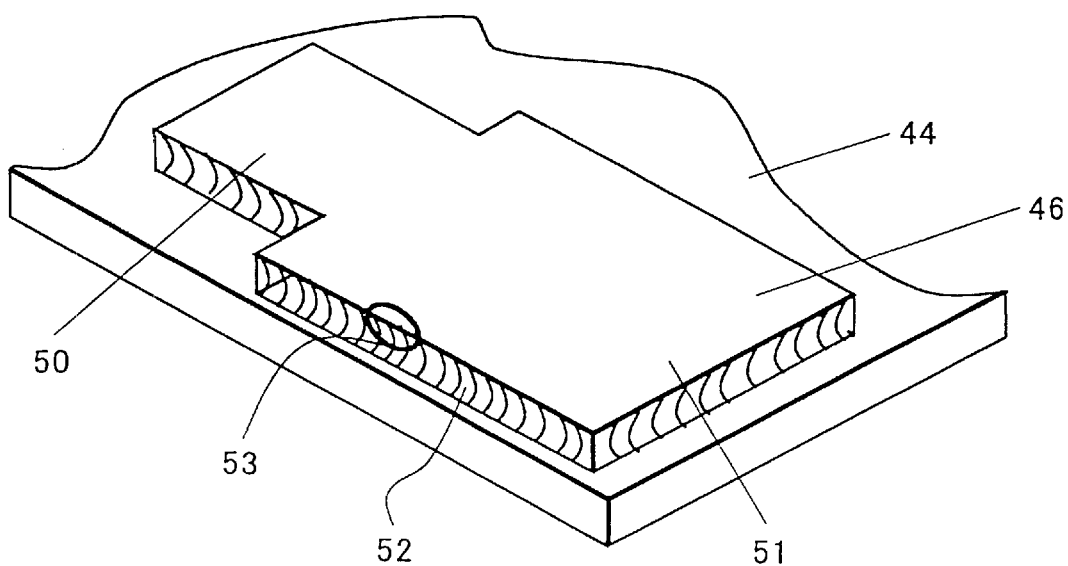

That is, as is shown in FIG. 1D, when the X-Y film is employed for a long conductive path or for one having large dimensions, such as a die pad or a bonding pad, or a wiring line, a conductive path possessing superior characteristics can be provided. In other words, when X-Y film is employed for the wiring line shown in FIGS. 6 to 11, characteristics can be provided that are superior to those provided when Z film is used.

Further, when consideration is given to manufacturing costs and resistance, rolled copper foil made mainly of Cu is preferable. However, while taking into account that the surface of Cu is easily oxidized and that the bonding of the fine metal line to an Au bump is difficult, as will be explained while referring to FIG. 3, it is important that the Z film 40 be disposed at the electrical joints of these components. Even when warping occurs and it causes a crack 49 to appear in the Z film 40, since X-Y film 46 is stably arranged below, fracturing is prevented.

It is known that an Ag plated film having a thickness of 2 to 10 μm will provide superior bonding, and that if a thicker film is deposited, the effectiveness of the bonding is reduced. It is also known that an Au plated film of about 0.2 μm provides a preferable bond. This is because as the thickness of a film increases, the growth rate of each crystal grain will differ greatly and the surface of the film will become rough. Further, it is known that, when the ball and the rough portion of Z film are bonded and connected together, connection strength will be depressed and connection resistance will be increased. Whereas, when thin Z film is employed to provide improved bonding, cracks or fractures tend to occur in the wiring line or the die pad, and reliability is reduced.

Therefore, according to the invention, X-Y film 46, which resists fractures, is employed for conductive paths, such as wiring lines 50 and die pads or bonding pads 51, and is also used as a support film as needed, and Z film 40 is formed on X-Y film 46. Further, a plated film, such as Ag, Au, Ni or Pd film and so on, is deposited as a portion that is required for improved bonding or for facilitating soldering. However, while taking connection strength and manufacturing costs into account, it must be noted that Z film 40 is thin, as has been previously discussed, and that therefore, no conductive paths are formed purely of Z film 40, but instead, X-Y film 46 is used as support film, or as protective film, and Z film 40 is formed thereon, thereby avoiding the deleterious results of characteristic deterioration factors, such as conductive path fractures or resistance increases.

Figure 3A:
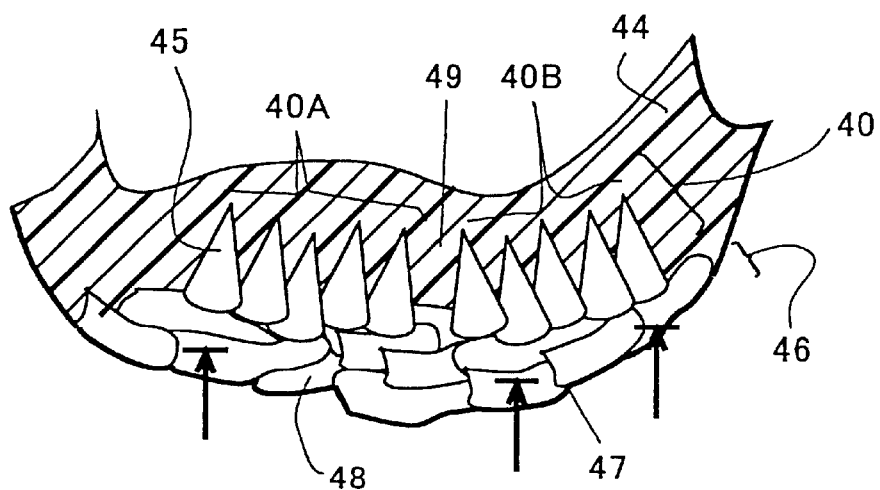
FIG. 3 is a diagram for explaining the X-Y film used for the semiconductor device according to the invention.

This point will now be discussed while referring to FIGS. 3A and 3B. In FIG. 3, due to the occurrence of a crack 49, the Z film 40 is divided into two areas 40A and 40B. However, since the two Z-axis grown films 40A and 40B are electrically connected to the X-Y film 46, in effect, the two Z-axis grown films are electrically interconnected, and a fracture failure does not occur. Further, the arrows indicate that the X-Y film 46 serves as a barrier film to prevent the intrusion of an external atmospheric gas, and thereby prevents the contamination of the surface of the Z film 40.

Figure 3B:
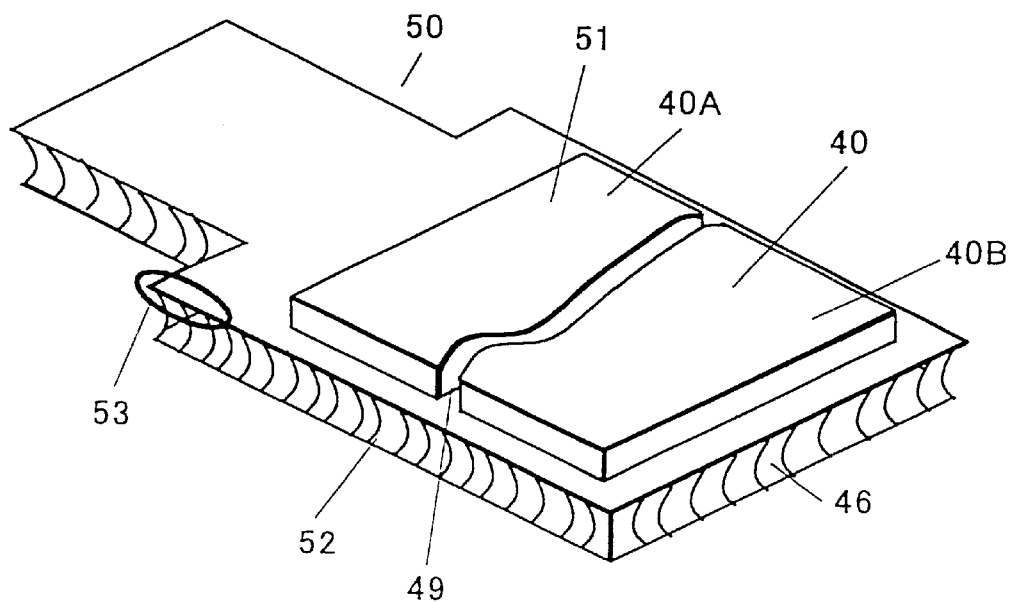

In FIGS. 1D and 3B, in addition to these characteristics, the following characteristic appears. A curved structure 52 and an eave 53 are formed on the side of the X-Y film 46, and these structures prevent the X-Y film 46 from peeling away from the insulating resin 44, ensuring that the X-Y film 46 is stably embedded in the insulating resin 44. As a result, the Z film 40 deposited on the X-Y film 46 is also stably retained.

Figure 4A:
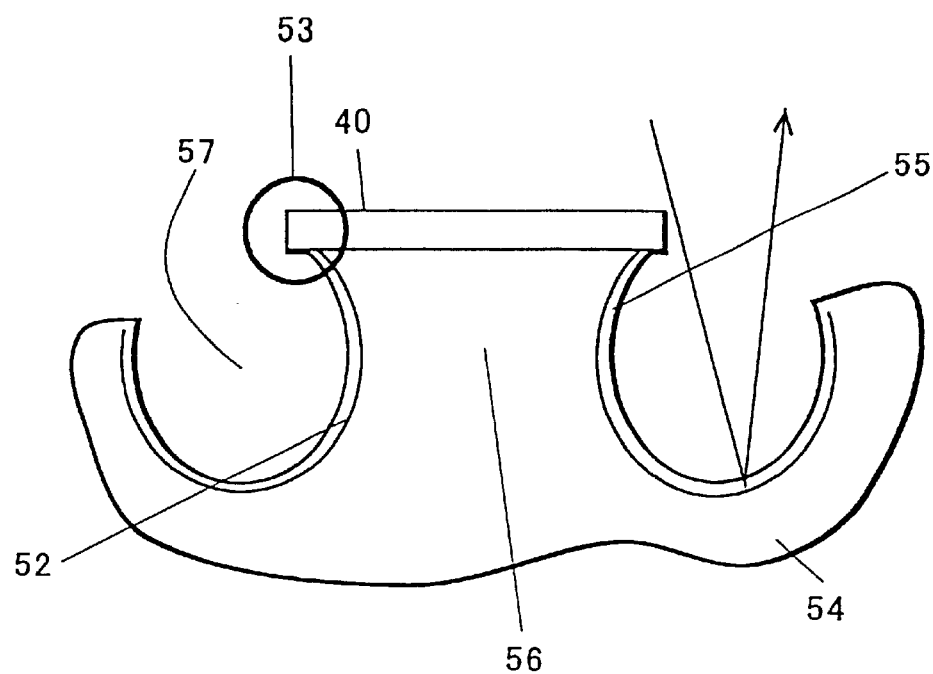
FIG. 4 is a diagram for explaining the structure of the surface of the X-Y film.
Figure 4B:
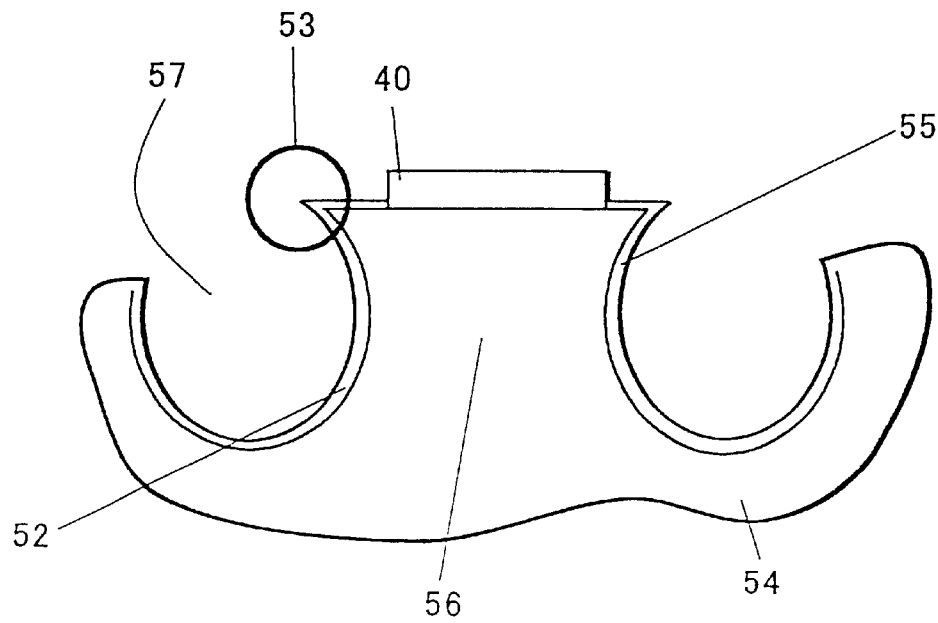

FIGS. 4A and 4B are diagrams showing conductive foil 54 that is half-etched before insulating resin 44 is used to seal it. A Cu oxide film ($Cu_2O$, $CuO$) 55 is deposited on the surface of the conductive foil 54, except an area whereat a Z film 40 is formed. The effectiveness of a chemical combination of a sealing material, included in the insulating resin 44 is increased by the copper oxide film 55, and the bonding of the conductive path 56 and the insulating resin 44 is improved.

In FIG. 4A, the Z film 40 is deposited across the entire upper face of the conductive path 56, and in FIG. 4B, the copper oxide film 55 is exposed except for the main area. Since more of the copper oxide film 55 is exposed in FIG. 4B than in FIG. 4A, an improved bond is provided for the upper face of the conductive path 56.

Furthermore, when separation grooves 57 are non-anisotropically formed in the conductive path 56 by half-etching, the following effects are obtained. First, since the curved structure 52 and the eaves 53 are generated, anchoring effects are obtained, and at the same time, since the area of the copper oxide film 55 is greater than that of the straight separation grooves 57, bonding with the insulating resin 44 is improved.

Finally, the rigidity of the assembly will be explained while referring to FIG. 2B. In the lower diagram in FIG. 2B, a conductive foil 54A having a lead frame shape is handled and attached to a die. A semiconductor maker performs transfer-molding using the lead frame, and the semiconductor device of this invention can be manufactured using this die. According to the invention, as will become obvious from the explanation given while referring to the drawings following FIG. 14, while taking into account the fact that the conductive foil 54 is easily handled and is sandwiched between the upper and lower dies, rigidity is needed in order for the conductive foil 54 to be half-etched and attached the dies. Since because of the manufacturing process an impurity can easily be added to the conductive foil 54 that is produced by rolling, rigidity can be increased. In the table in FIG. 2B, the weight % of various impurities is shown. For type A, mainly Ni, Si, Zn and Sn are employed as impurities, for type B, the impurities Zn, Sn and Cr are mixed in, and for type C, the impurities Zn, Fe and P are mixed in. The impurity types and the weight %s shown in this table are merely examples, and any impurity can be employed so long it imparts rigidity to the conductive foil which contains Cu as its main material.

When conductive foil is formed only of plated film, it is difficult to mix in impurities because of the manufacturing method, so that substantially, the conductive foil is formed of pure copper. Therefore, since the conductive foil is soft, during the processing this foil is deteriorated, and a substrate for supporting the conductive foil is required.

Generally, in consonance with an increase in the size of the lead frame, the number of mounted semiconductor devices is increased. However, as the lead frame is then large, it tends to be warped or bent, and processing efficiency is reduced. According to the invention, a rectangular conductive foil 220 mm long, 45 mm wide and 70 μm thick is employed. A commonly employed lead frame has a maximum length of 250 mm, a maximum width of 75 mm and a maximum thickness of 0.5 mm, and when the standard conductive foil used in this field is employed, the dies used for molding the lead frame can be employed.

The structure of a semiconductor device will now be specifically described.

The semiconductor devices produced in accordance with the invention can be roughly sorted into a discrete type, wherein one TR is sealed in a device; a BGA type, wherein one IC or LSI is sealed in a device; a multi-chip type, wherein multiple TRs or multiple ICs are mounted; and a hybrid type, wherein multiple TRs, multiple ICs and/or passive elements are mounted and wiring lines are employed as conductive paths to constitute a desired circuit. That is, the method of the invention is important because almost all types of packaged semiconductor elements can be provided using this method.

Second Embodiment for Explaining the Discrete Type Semiconductor Device

FIGS. 5A to 5E are diagrams showing a package for a TR, wherein conductive paths 32 to 34 are embedded in an insulating resin 35 and their back surfaces are exposed.

Figure 5A:
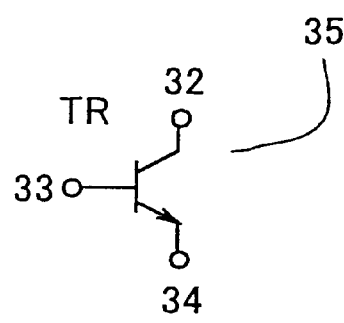
FIG. 5 is a diagram for explaining the semiconductor device of the invention.
Figure 5B:
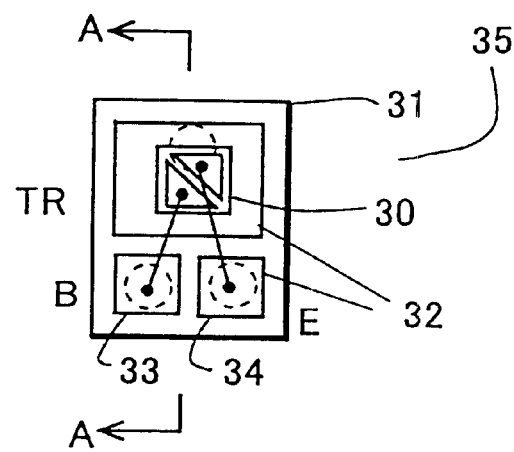
Figure 5C:
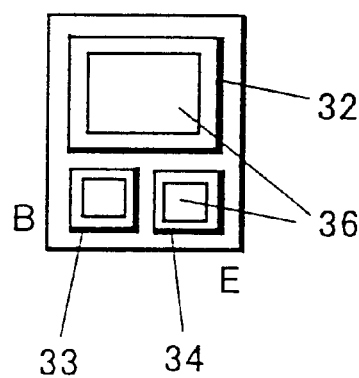

The conductive paths 32 to 34 serve as a collector electrode, a base electrode and an emitter electrode, and Ag film is deposited as a Z film 36 on the surfaces of the paths 32 to 34, as shown in FIG. 5C. The Z film 36 enables wire bonding or die bonding, and Au, Pd or Ni may be employed as the Z film 36. Since the conductive paths 32 to 34 are etched non-anisotropically, the side walls form curved structures 52, and eaves 53 can be formed over the surfaces of the conductive paths. Therefore, when at the least curved structures 52 or eaves 53 are employed, an anchoring effect can be provided with the insulating resin 35. Further, the insulating resin 35 is used to fill in separation grooves 57 formed by half-etching, and the insulating resin 35 that is exposed on the back surface of a semiconductor device 31 serves as the external case of the package. Since the separation grooves 57 are formed by half-etching and their bottom portions are characteristically curved, the friction coefficient of the chip can be reduced. In addition, since the bottoms of the separation grooves 57 extend downward below the back surfaces of the conductive paths 32 to 34, short-circuiting of the conductive paths 32 to 34 can be prevented, and a thicker connection material, such as soldering, can be deposited.

Figure 5D:
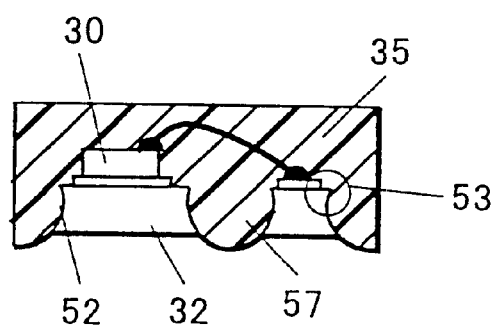
Figure 5E:
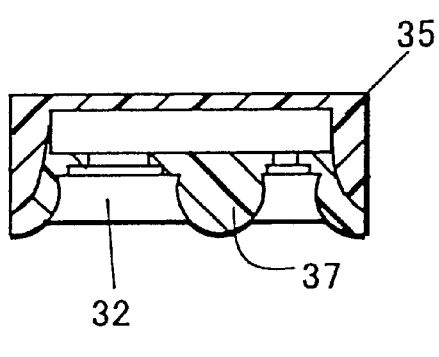
Figure 5F:
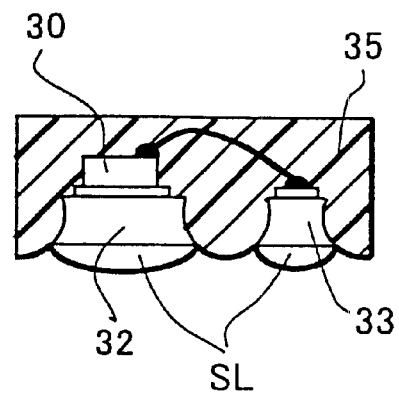

FIG. 5E is a diagram showing a semiconductor device wherein the semiconductor chip 30 is mounted face down. A solder ball is formed on the surface of the semiconductor element and melted along the conductive path. When the gap between the semiconductor chip 30 and the conductive path is much narrower and the permeability of the insulating resin 35 is low, an under-filling material 37 that has low viscosity and can easily permeate the gap is employed. In this case, unlike FIG. 5D, the under-filling material 37 is used to fill the separation grooves 57, and serves as one of the elements that form the external shape. Further, as shown in FIGS. 5D and 5E, since the conductive paths are exposed, an appropriate conductive material is selected and used to cover the conductive paths so that they can be electrically connected to the circuit pattern of the substrate. As is shown in FIG. 5F, a brazing material, such as solder, a plating material, such as SL, Au or Ag, or a conductive paste is applied to the exposed portions.

Figure 5G:
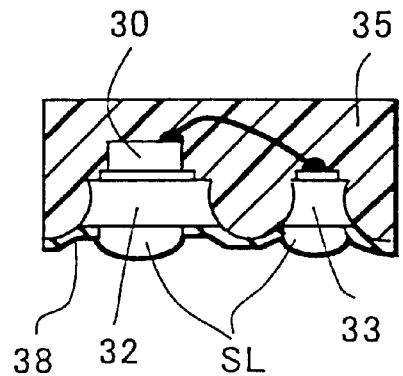

Furthermore, since the sizes of the exposed portions of the conductive paths differ, the thicknesses of the brazing material also differ. Therefore, as is shown in FIG. 5G, an insulating film 38 may be deposited on the back surface to substantially equalize the shapes of the exposed portions.

As was explained at the beginning of this embodiment, it is apparent that when an approximately 0.55×0.55 mm semiconductor chip having a thickness of 0.24 mm is molded to prepare a semiconductor device, a very thin 1.6×2.3 mm semiconductor device 31 having a maximum thickness of 0.5 mm can be obtained, and is appropriate for use for a portable device or a computer system.

Second Embodiment for Explaining the Multi-chip Type (or Hybrid Type) Semiconductor Device FIGS. 6A to 6E are diagrams showing a hybrid or a multi-chip type semiconductor device 60. Since the semiconductor device is constituted merely by a transistor chip, it is considered to be a multi-chip type, and when passive elements, such as a capacitor and a resistor, are additionally provided, a hybrid type semiconductor device is obtained.

Figure 24:
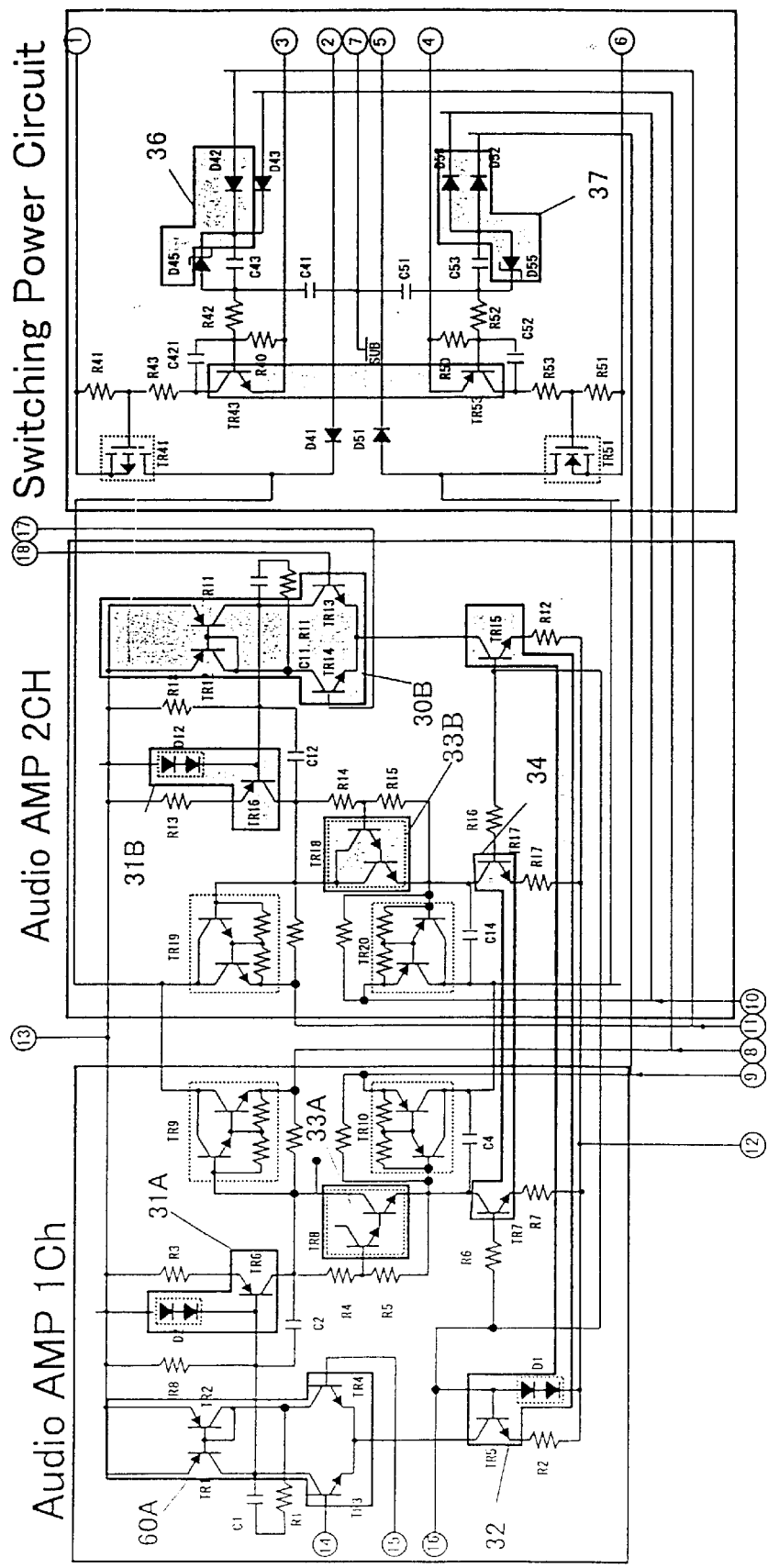
FIG. 24 is a diagram for explaining an example circuit used for the semiconductor device of the invention.

FIG. 24 is a diagram showing an audio circuit that comprises an Audio Amp 1ch section, an Audio Amp 2ch section and a switching power supply unit, all of which are described using thick, chain lines.

For each unit, a circuit enclosed by a solid line is provided as a semiconductor device. In FIG. 24, three types of semiconductor devices and two semiconductor devices integrally formed with the Audio Amp 2ch section are provided for the Audio Amp 1ch section.

Figure 6A:
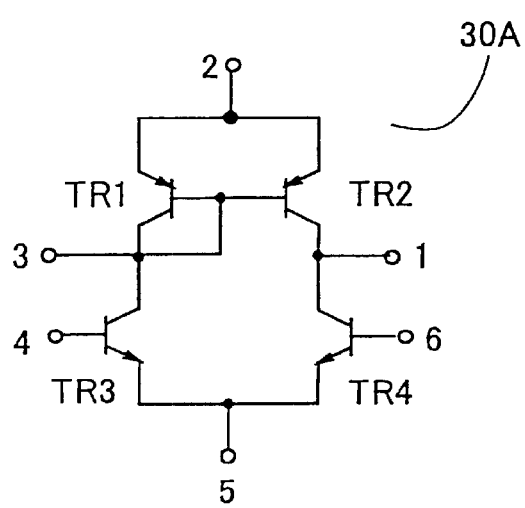
FIG. 6 is a diagram for explaining the semiconductor device of the invention.
Figure 6B:
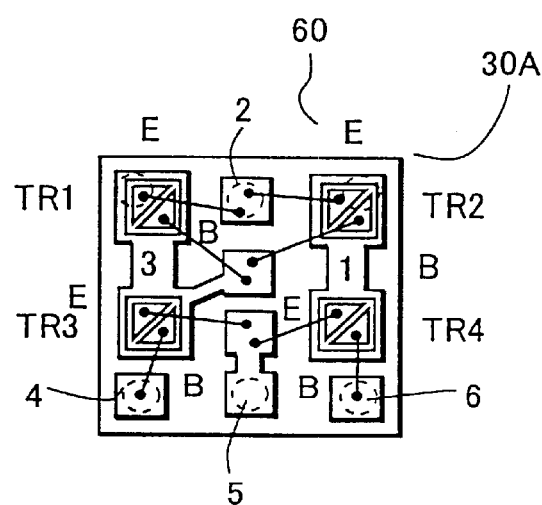
Figure 6C:
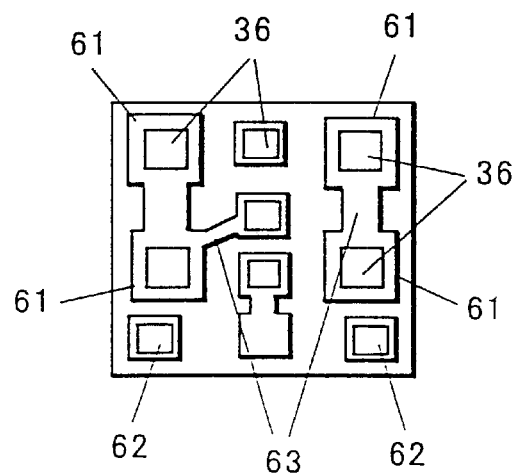
Figure 6D:
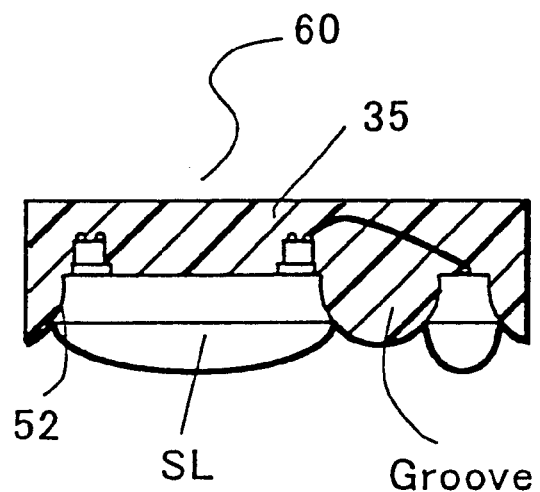
Figure 6E:
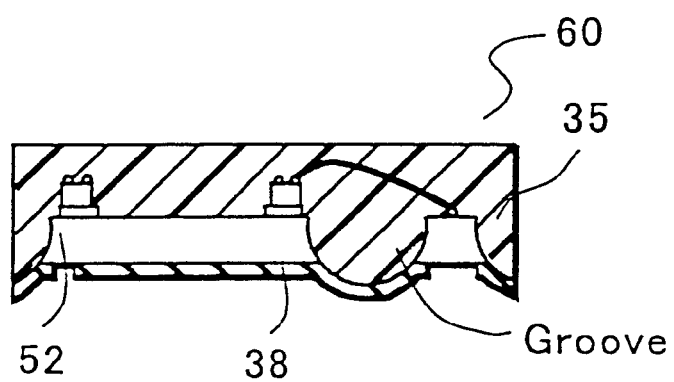
Figure 11:
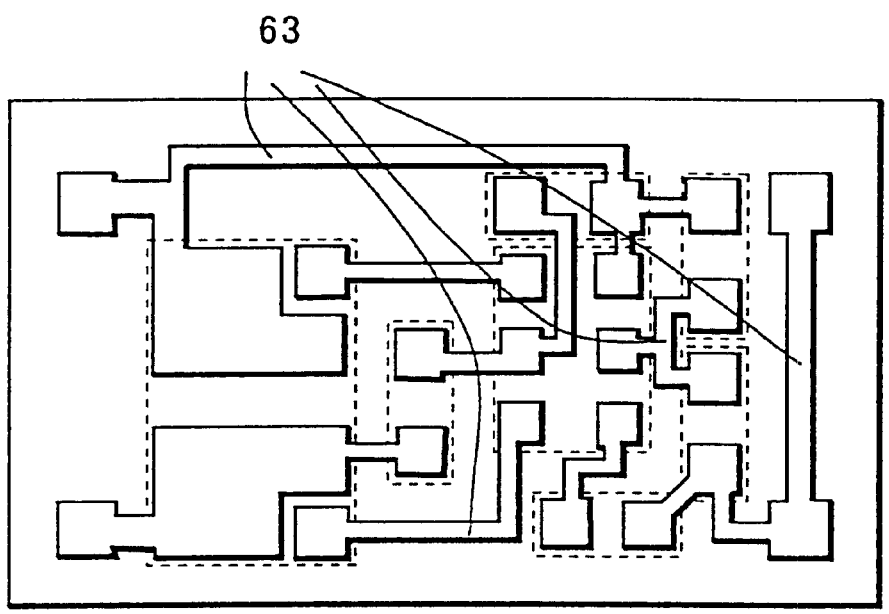
FIG. 11 is a diagram for explaining a conductive pattern used for the semiconductor device of the invention.

In this embodiment, the semiconductor device 60 is shown as an example in FIGS. 6A to 6E. As is shown in FIG. 6A, a current mirror circuit including TR1 and TR2 and a differential circuit including TR3 and TR4 are integrally formed. The resultant semiconductor device 60 is shown in FIGS. 6B to 6E. For this device 60, four 0.55×0.55 mm transistor chips having thicknesses of 0.24 mm are employed and are bonded together by fine Au lines. It should be noted that the semiconductor device 60 is 2.9×2.9 mm and that it is 0.5 mm thick. FIG. 6C is a diagram showing die pads 61 and bonding pads 62 on which the Z film 36 is deposited, and wiring lines 63 for electrically connecting these pads. Specifically, while very short wiring lines 63 are provided, actually, they may be extended as is shown in FIG. 11.

The wiring lines 63 constitute the feature of the invention; rolled copper foil is employed as the main material for the lines. While depending on the size of the circuit in FIG. 6A, as the plane size of a package is expanded, the length of each wiring line in the package is accordingly increased. Further, because of a difference in thermal expansion coefficients between the insulating resin 35 and conductive paths, wiring lines are warped each time heat is applied. However, as is shown in FIG. 2A, since the rolled copper foil (X-Y film) is resistant to repetitious warping (bending), cracks in the lines can be supressed.

Third Embodiment for Explaining a BGA Type Semiconductor Device

Figure 7A:
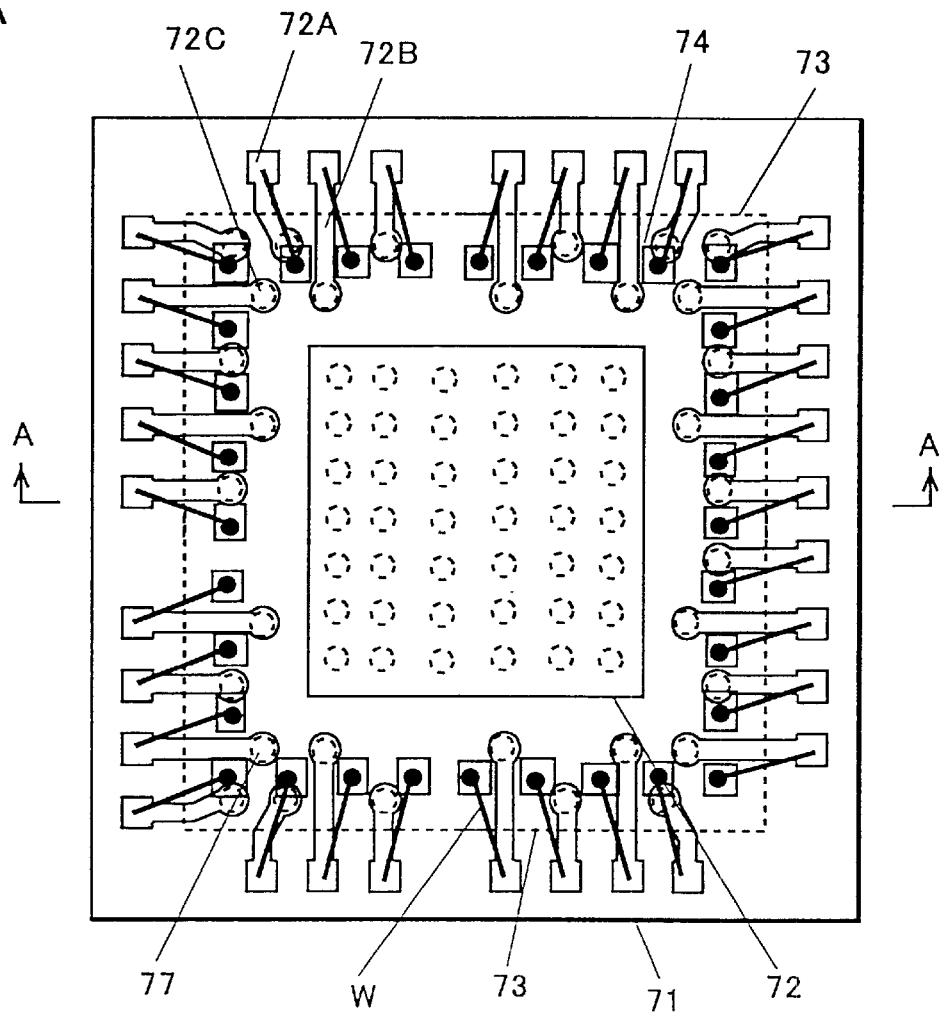
FIG. 7 is a diagram for explaining the semiconductor device of the invention.
Figure 7B:
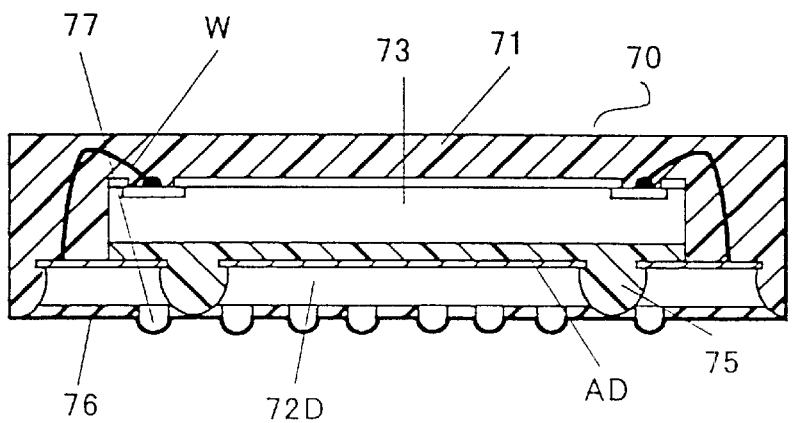

First, a semiconductor device 70 will be described while referring to FIGS. 7A and 7B. In FIGS. 7A and 7B, the following components are embedded in an insulating resin 71: bonding pads 72A, wiring lines 72B, integrally formed with the bonding pads 72A, and external connection electrodes 72C, integrally formed with and provided at the ends of the wiring lines 72B. Additionally embedded in the insulating resin 71 are heat discharge electrodes 72D, which are arranged in specific areas enclosed by the conductive patterns 72A to 72C, and a semiconductor element 73, which is arranged on the electrodes 72D. The semiconductor element 73 is securely adhered to the heat discharge electrodes 72D via insulating adhesion means AD, and is indicated by a broken line in FIG. 7A. In order to enable bonding, the bonding pads 72A are arranged in a pattern around the semiconductor element 73, and are electrically connected, via fine metal lines W, to bonding electrodes 74 on the semiconductor element 73.

The side walls of the conductive patterns 72A to 72D are etched non-anisotropically. Since wet etching is performed in this embodiment, a curved structure is obtained that provides anchoring effects.

This structure comprises the semiconductor element 73, the conductive patterns 72A to 72C, the heat discharge electrodes 72D, the fine metal lines W, the insulating adhesion means AD and the insulating resin 71 in which these components are embedded. In the area wherein the semiconductor element 73 is arranged, the insulating adhesion means AD is formed on the conductive patterns 72B to 72D and fills in separation grooves 75 between them. Specifically, the insulating adhesion means AD permeates the separation grooves 75 that are formed by etching. Finally, the structure is sealed using the insulating resin 71, so that the back surfaces of the conductive patterns 72A to 72D are exposed.

An adhesive formed of an insulating material or an adhesive insulating sheet is preferable as the insulating adhesion means AD. As will become obvious during the course of the following explanation of the manufacturing method, a material that can be glued to the entire wafer and that can be patterned by photolithography is preferable.

A thermosetting resin, such as an epoxy resin, or thermoplastic resin, such as a polyimido resin or a polyphenylene sulfide, can be employed as the insulating resin 71. Further, as the insulating resin, a resin can be employed that solidifies when dies are used or that is deposited by dipping or coating.

While taking into account half-etching, plating formation, heat resistance, and stress and bending resistance, a rolled copper foil or a conductive material that contains copper as its main material and that is formed by rolling is preferable for the conductive patterns 72A to 72D.

According to the invention, since the insulating resin 71 is used and the insulating adhesion means AD is employed to permeate the separation grooves 75, the conductive pattern can be prevented from sliding. Further, since for dry etching or for wet etching non-anisotropic etching is performed, the side walls of the conductive patterns are formed as curved structures and provide anchoring effects. As a result, a structure can be provided that ensures the conductive patterns 72A to 72D will not slip off the insulating resin 71.

Furthermore, since on the back surface of the package the back surfaces of the conductive patterns 72A to 72D are exposed, the back surfaces of the heat discharge electrodes 72D can be bonded to electrodes on the substrate. Thus, heat generated by the semiconductor element 73 can be discharged to the substrate electrodes, thereby preventing a rise in the temperature of the semiconductor element 73, and accordingly, permitting the drive current for the semiconductor element 73 to be increased. Further, to thermally couple the heat discharge electrodes 72D and the substrate electrodes, a brazing material or a conductive paste may be used, or an insulating material having superior thermal conductivity, such as silicon, may be arranged between the electrodes.

For the semiconductor device of this embodiment, since the conductive patterns 72A to 72D are supported by the insulating resin 71, which is a sealing resin, a support substrate is not required. This structure is the feature of the invention. In a conventional semiconductor device the conductive paths are supported by a support substrate (a flexible sheet, a printed circuit board or a ceramic substrate) or a lead frame, and thus a structure is added that originally is not always required. However, since the semiconductor device of this invention is constituted by the minimum number of required components, and does not require a support substrate, it can be made thin and light, and further, because material expenses can be reduced it can be provided at a low cost.

The conductive patterns 72A to 72D are exposed at the back surface of the package. And when a brazing material, such as solder, is used to coat this exposed area, the brazing material wets the area heavily because the area for the heat discharge electrodes 72 is larger. Therefore, in order for the electrodes 72D to adhere to the substrate, the brazing material on the back surfaces of the connection electrodes 72C does not wet the electrodes of the substrate, and a connection failure may occur.

In order to avoid this phenomenon, an insulating film 76 is formed on the back surface of the semiconductor device 70. The external connection electrodes 72C and the heat discharge electrodes 72D that are exposed through the insulating film 76 are described by broken-line circles in FIG. 7A. In other words, on the back surface of the semiconductor device 70 only those portions inside the broken-line circles are not covered by the insulating film 76, and since all these portions are substantially the same size, brazing material having the same thickness can be deposited on them. The same thing can be applied after solder printing or after reflow, and also when a conductive paste, such as Ag, Au or Ag—Pd, is employed. With this structure, electric connection failures can also be prevented. And while taking into account the discharge of heat by the semiconductor device 73, the exposed portions 77 of the heat discharge electrodes 72D may be larger than the exposed portions of the external connection electrodes 72C. Further, since all the external connection electrodes 72C are substantially the same size, the external connection electrodes 72C may be exposed across the entire area, and one part of the back surfaces of the heat discharge electrodes 72D may be exposed through the insulating film 76 that have substantially the same size as the external connection electrodes 72C.

Furthermore, when the insulating film 76 is deposited, the wiring lines provided for the substrate can be extended to the back surface of the semiconductor device. Generally, the wiring lines laid on the substrate are detoured around the area to which the semiconductor device is bonded; however, when the insulating film 76 is deposited, the wiring lines can be attached without being detoured. Further, since the insulating resin 71 and the insulating adhesion means AD project outward from the conductive pattern, a gap is defined between the wiring lines on the substrate and the conductive patterns, and short-circuiting is prevented.

Fourth Embodiment for Explaining a BGA Type Semiconductor Device

Figure 8A:
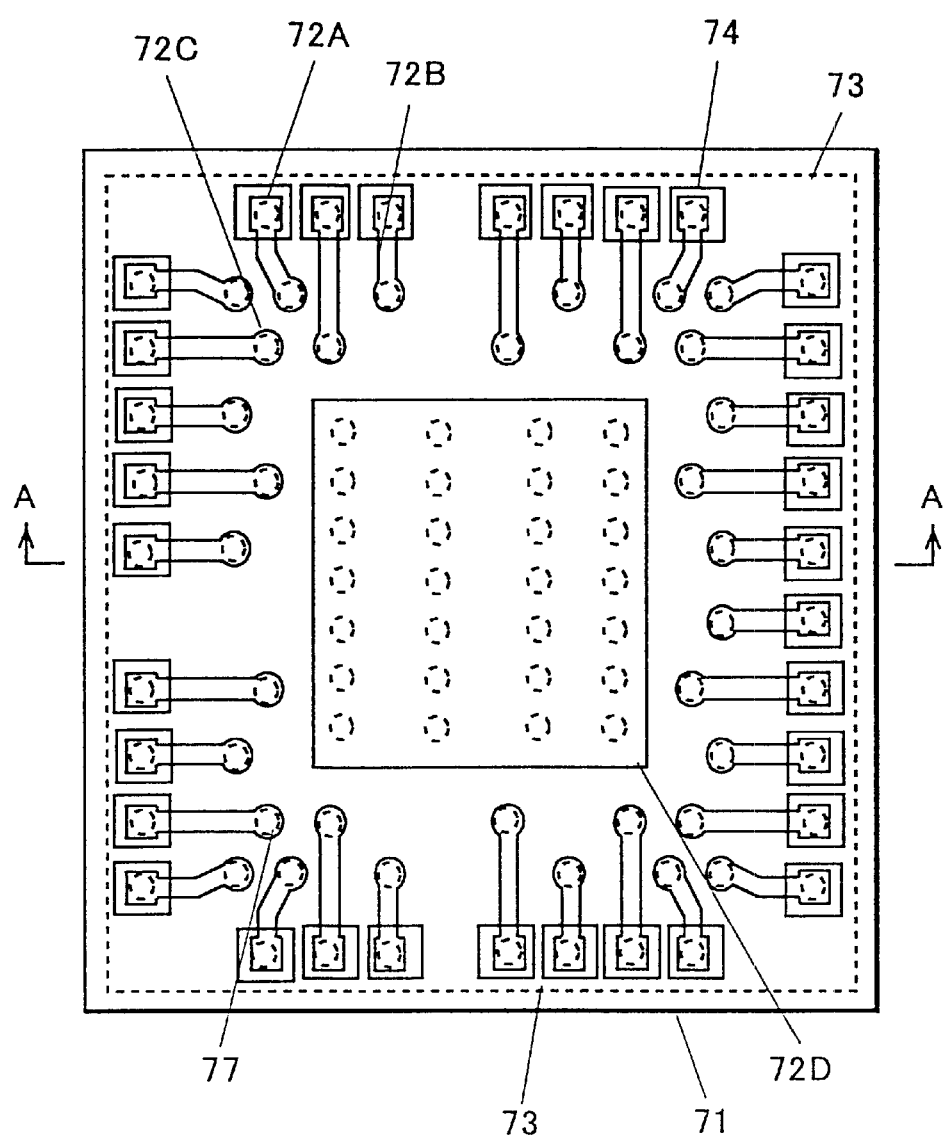
FIG. 8 Is a diagram for explaining the semiconductor device of the invention.
Figure 8B:
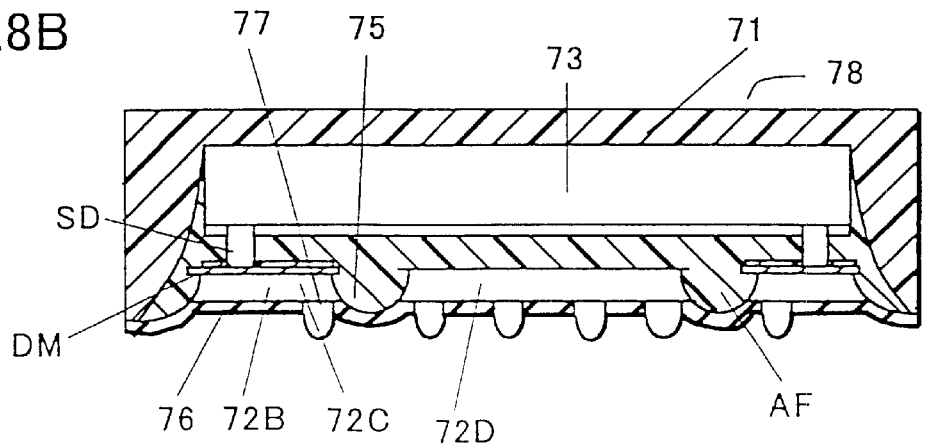

In FIGS. 8A and 8B, since substantially the same structure is employed except that the semiconductor element 73 is mounted face down, a flow prevention film DM is deposited on the conductive pattern, and an under-filling material AF is employed instead of the insulating adhesion means AD, only these differences will now be described.

First, bonding electrodes 74 and pads 72A in the semiconductor element 73 are electrically connected via electrical connection means SD, a brazing material such as solder, a conductive paste or anisotropic conductive resin.

In order to prevent the flowing of the electrical connection means SD, a flow prevention film DM is formed on the conductive pattern. Using solder as an example, the flow prevention film DM is deposited at least on one part of the conductive patterns 72A to 72C, and prevents the flowing of the solder. The flow prevention film can be a film that is resistant to wetting by the solder, such as a polymer film (solder resist film) or an oxide film deposited on an Ni surface.

The flow prevention film, which is deposited at least around the area where the solder is located, prevents the flow of a brazing material, such as solder, a conductive paste, such as an Ag paste, or a conductive resin, and is resistant against of the wetting of the electrical connection means. When, for example, solder is used, the flow prevention film DM blocks the melting solder, and due to surface tension, forms a perfect semi-spherical mass of solder. Further, since a passivation film is deposited around the bonding electrodes 74 of the semiconductor element 73 whereat the solder is provided, the solder wets only the bonding electrodes 74. Therefore, when the semiconductor element 73 is connected to the pads via the solder, the solder is maintained at a constant height and has the cylindrical shape. Further, since this height can be adjusted by controlling the volume of the solder, a constant gap can be defined between the semiconductor element and the conductive pattern, so that a cleaning liquid, or a slightly viscous adhesive (an under-filling material in this embodiment) can enter the gap. In addition, since the flow prevention film DM is deposited on an area other than a connection area, the adhesion to the under-filling material AF can also be increased.

The structure of this embodiment comprises the semiconductor element 73, the conductive patterns 72A to 72C, the heat discharge electrodes 72D, the under-filling material AF and the insulating resin 71 in which all of these components are embedded. As was previously described, in the area where the semiconductor element 73 is arranged, the under-filling material AF is provided for the conductive patterns 72A to 72D and in the separation grooves between them. Especially, the under-filling material AF is filled in the separation grooves 75 that are formed by etching, and the entire resultant structure is sealed by the insulating resin 71. With this arrangement, the conductive patterns 72A to 72D and the semiconductor element 73 are supported by the insulating resin 71 and the under-filling material AF.

A material that can enter the gap between the semiconductor element 73 and the conductive patterns 72A to 72C is preferable as the under-filling material AF, and further, a filler that serves as a spacer and contributes to thermal transmission may enter the gap.

According to the invention, since the insulating resin 71 and the under-filling material AF are used to fill the separation grooves 75, the obtained anchoring effects can prevent the conductive pattern from slipping off. Further, since for dry etching or wet etching non-anisotropic etching is employed, the side walls of the pads 72A can be curved. Therefore, a resultant structure can be provided wherein the conductive patterns 72A to 72D will not slip off the package.

In addition, the back surfaces of the conductive patterns 72A to 72D are exposed through the insulating resin 71, and the back surface of the heat discharge electrode 72D can especially be securely attached to the circuit pattern on the substrate (not shown). With this structure, the heat generated by the semiconductor element 73 can be discharged to the second circuit pattern on the substrate, so that a rise in the temperature of the semiconductor element 73 can be prevented and the drive current applied to the element 73 can be increased. Further, when heat discharge is not taken into account, the heat discharge electrode 72D may not be provided, and in such a case, the circuit pattern of the substrate would be eliminated.

For the semiconductor device of this embodiment, since the conductive patterns 72A to 72D are sealed by the insulating resin 71 or the under-filling material AF, which is a sealing resin, a support substrate is not required. This structure is the feature of the invention. As was described in the sub-division for prior art, the copper foil pattern of a conventional semiconductor device is supported by a support substrate (a flexible sheet, a printed circuit board or a ceramic substrate) or a lead frame, and thus a structure is added that originally is not always required. However, since the semiconductor device of this invention is constituted by the minimum number of required components, and does not require a support substrate, it can be made thin and light, and further, because material expenses can be reduced it can be provided at a low cost.

The semiconductor device of this embodiment includes a first heat discharge path, which runs through the external connection electrode 72C and the brazing material, and a second heat discharge path, which runs through the heat discharge electrode 72D and the brazing material, which together contribute to an improvement in the driving capability of the semiconductor device.

The back surface of the semiconductor element 73 may be exposed through the insulating resin film 71, so that an increase in the effectiveness of the thermal coupling of the heat discharge means and the semiconductor element 73 can attained. It should be noted that when the heat discharge means should not be electrically connected to the semiconductor element 73, an insulating material, such as a silicon resin, is used to form a barrier between them. Silicon resin has frequently been employed in this manner, since it is resistant to heat and provides superior heat transmission capabilities when a filler is mixed with it.

Fifth Embodiment for Explaining a BGA Type Semiconductor Device 79

Figure 9A:
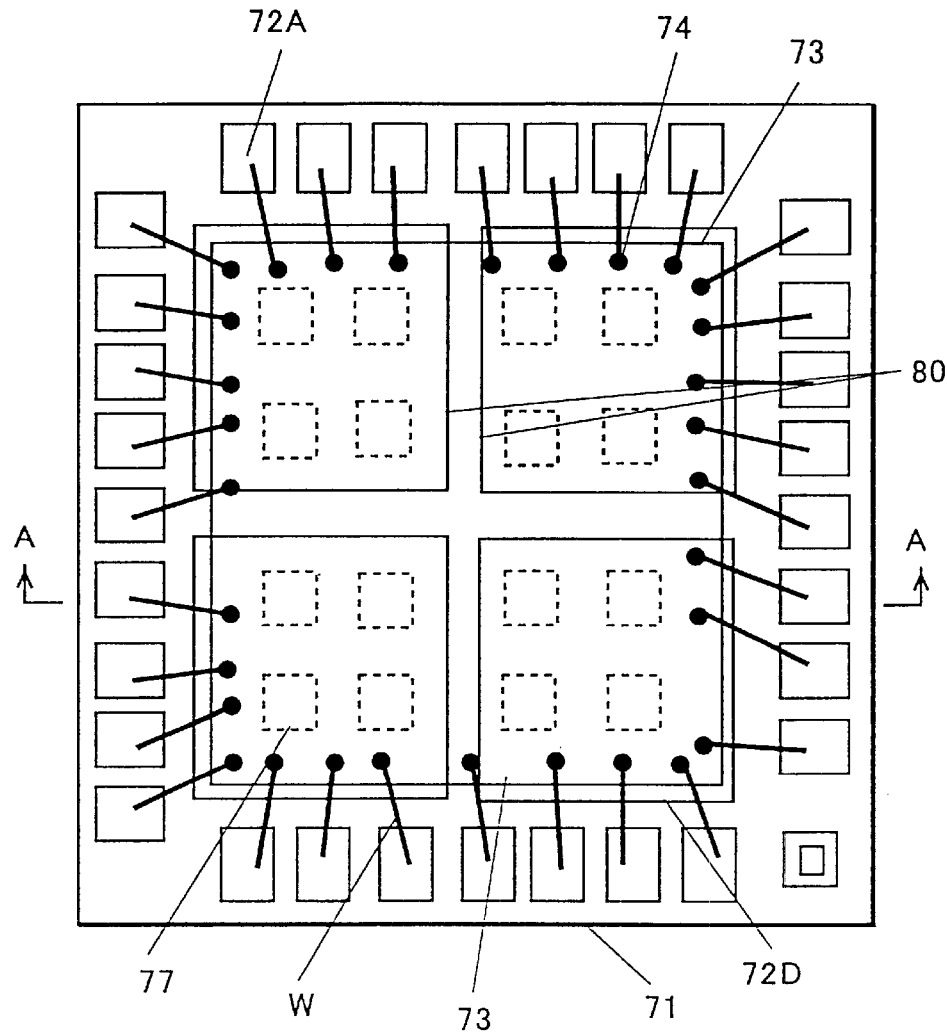
FIG. 9 is a diagram for explaining the semiconductor device of the invention.
Figure 9B:
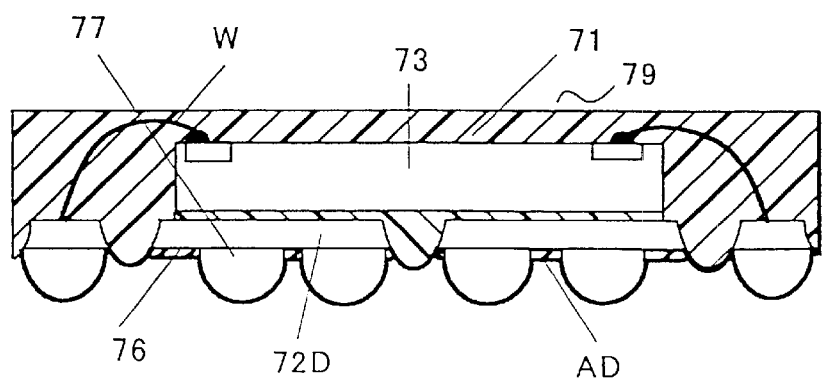

In FIGS. 8A and 8B, the wiring lines 72B and the external connection electrodes 72C are integrally formed on the pads 72A. In this embodiment, as is shown in FIGS. 9A and 9B, the back surfaces of bonding pads 72A serve as the external connection electrodes.

Further, since the bonding pads 72A are formed in a rectangular shape, heat discharge electrodes 72D that are exposed through an insulating film 76 are formed using the same pattern. In addition, while taking into account the bonding capability of insulating adhesion means AD, grooves 80 are formed so as to provide multiple heat discharge electrodes 72D. Fine metal lines W are also used to connect a semiconductor element 73 to the bonding pads 72A.

The semiconductor element 73 may be mounted face down, and in this case, the under-filling material is employed as is shown in FIGS. 8A and 8B. In this embodiment, since the wiring lines and the external connection electrodes are not formed, enlarged heat discharge electrodes 72D can be formed, and the discharge of heat from the semiconductor element can be improved.

Sixth Embodiment for Explaining a Multi-chip Semiconductor Device 81

Figure 10A:
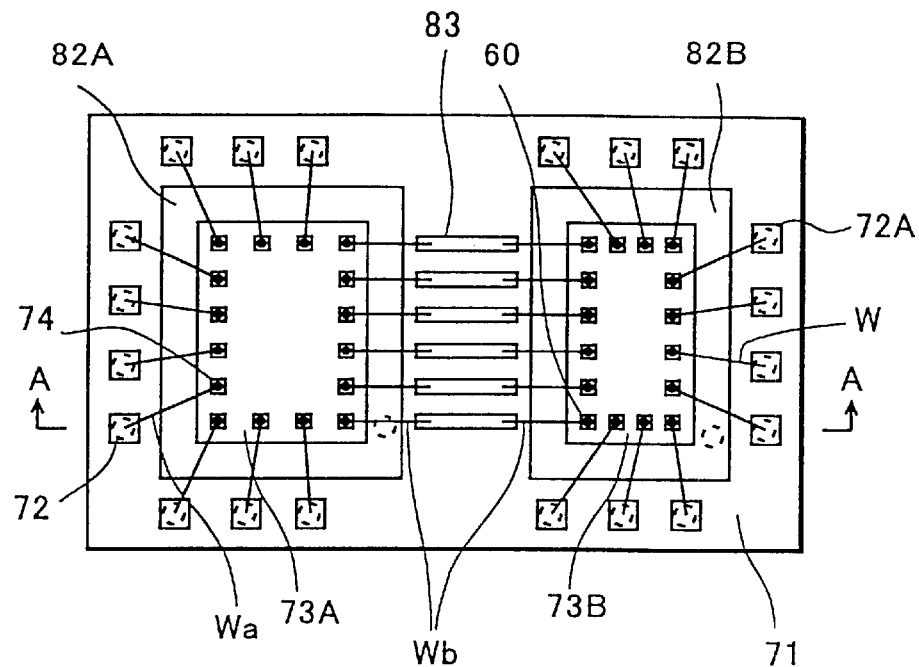
FIG. 10 is a diagram for explaining the semiconductor device of the invention.
Figure 10B:
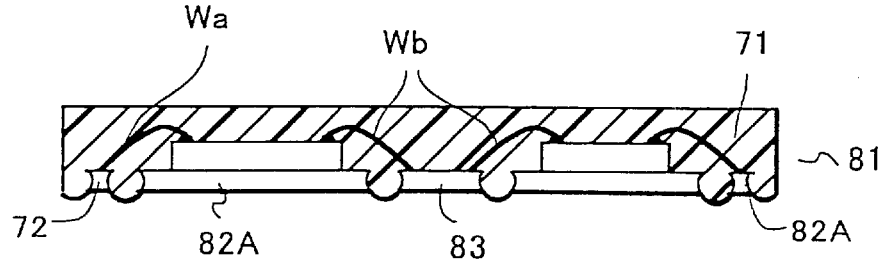

While referring to FIGS. 10A to 10C, an explanation will now be given for a semiconductor device 81 wherein semiconductor chips 73A and 73B are mounted using the mounting method shown in FIGS. 9A and 9B.

In this embodiment, the first semiconductor chip 73A and the second semiconductor chip 73B are electrically connected by using a bridge 83. When the bridge 83 is formed on a lead frame, it is shaped like an island, and must be supported by a hanging lead or adhesive tape. As will be apparent from the description of the manufacturing method that will be given later, since the conductive paths are separated after the conductive foil has been half etched and the resin has been molded, support members are not required. Further, the fine metal lines W are connected to the semiconductor chips 73A and 73B by ball bonding, and are connected to the bridge 83 by stitch bonding. Thus, an impact at the stitch bonding is not transmitted to the chips.

In addition, as is shown in FIGS. 7A and 7B, the external connection electrodes and the wiring line might be integrally formed with the bonding pads 72A. In this case, the first die pad 82A and the second die pad 82B should be made smaller than the semiconductor chips 73A and 73B, and the area whereat the wiring lines and the external connection electrodes are arranged should be enlarged. Furthermore, a semiconductor chip 73 and a die pad 82 are electrically connected together by a brazing material, such as solder. When the wiring lines and the external connection electrodes are extended under the semiconductor chip, the insulating adhesion means AD should be provided in order to prevent short circuits.

Figure 10C:
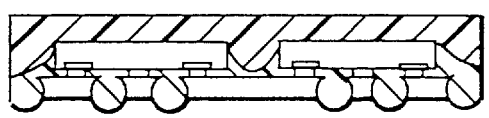

The semiconductor chip 73 may be mounted face down, as is shown in FIG. 10C. This structure is substantially the same as that shown in FIGS. 8A and 8B. Since a semiconductor chip 73 and a die pad 82 are connected by a brazing material, such as solder, the under-filling material AF is used to fill the gap between them.

Figure 12A:
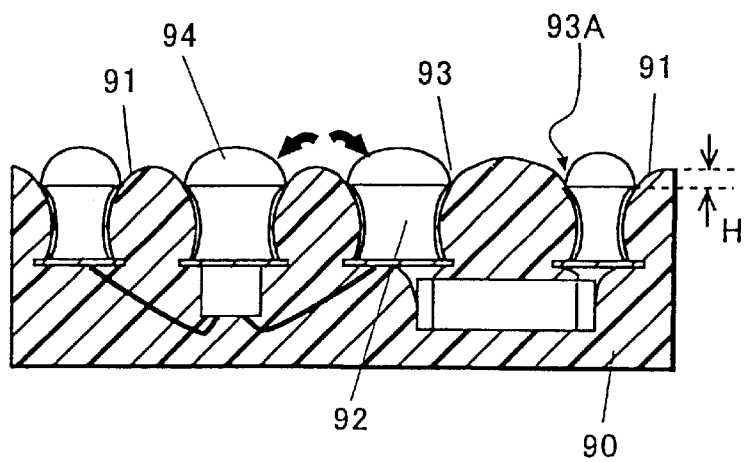
FIG. 12 is a diagram for explaining the semiconductor device of the invention.
Figure 12B:
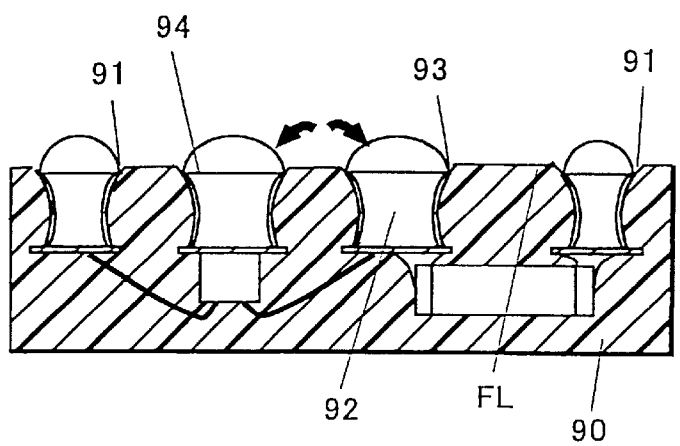
Figure 13:
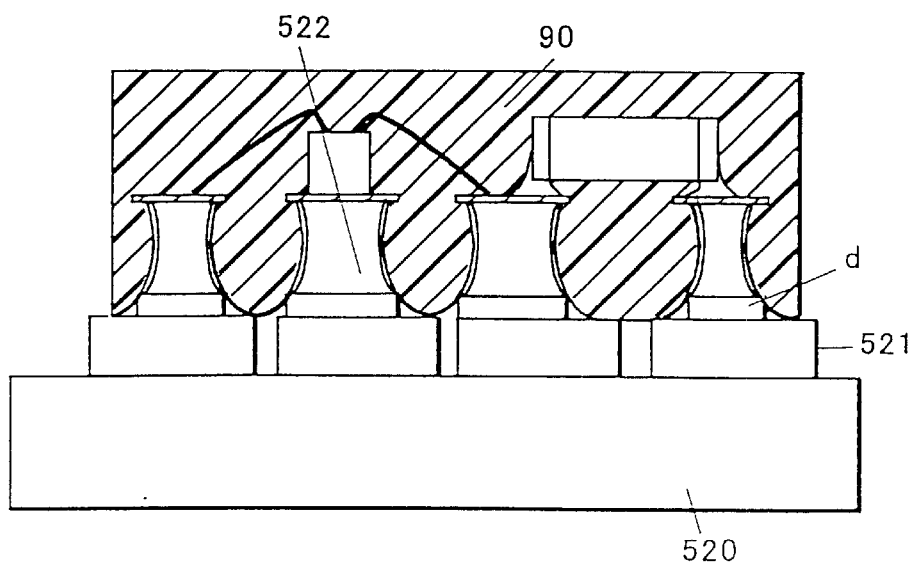
FIG. 13 is a diagram for explaining a substrate on which the semiconductor device of the invention is mounted.

Seventh Embodiment for Explaining the Feature of a Semiconductor Device and the Manufacturing Method Therefor According to the feature shown in FIGS. 12A, 12B and 13, projecting portions 91 composed of an insulating resin 90 are formed, and conductive paths 92 are recessed relative to the projected portions 91 to provide recessed portions 93. With this structure, the connection strength of solder 94 can be increased, short circuits caused to the solder 94 for each other or to the conductive paths 94 for each other can be prevented, and the friction coefficient for the back surface of a semiconductor device can be reduced.

The method for manufacturing the semiconductor device will now be described while referring to FIGS. 14 to 21.

Figure 14:
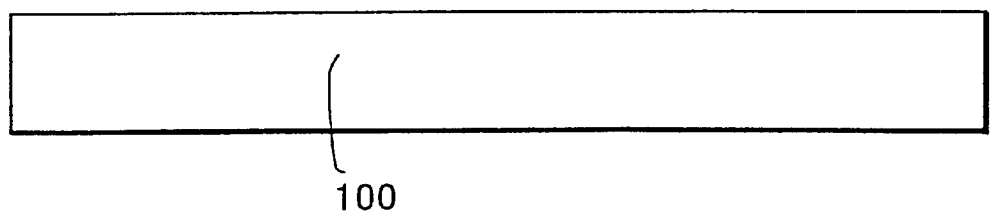
FIG. 14 is a diagram for explaining a method for manufacturing the semiconductor device of the invention.

First, as is shown in FIG. 14, a sheet-shaped conductive foil 100 is prepared. The material for the copper foil 100 is selected while taking into account the adhesiveness, and the bonding and plating properties of the brazing material, and a rolled conductive foil containing Cu as the main material is employed. Further, in order that the conductive foil 100 can be easily handled at each step, an impurity is diffused in the material to impart rigidity. Example impurities are shown in FIG. 2B.

While taking the succeeding etching process into account, the thickness of the conductive foil 100 is preferably 35 to 300 $\mu$m, and in this embodiment, copper foil having a thickness of 70 $\mu$m (2 ounces) is prepared. However, basically, copper foil of which thickness is either no less than 300 $\mu$m or no more than 35 $\mu$m may be also employed, and as will be stated below, any thickness can be used so long as separation grooves 101 that are smaller than the thickness of the conductive foil 100 can be formed. Further, while taking into account the succeeding transfer molding process, a transfer molding die is generally used for the post-process, the standard conductive foil being used for this die, the conductive foil should be cut in strips a maximum of 220 mm long, a maximum of 75 mm wide and a maximum of 300 mm thick. When conductive foil this size is adopted for use, a transfer molding device, a die and a conductive foil available on the market can be employed, and manufacturing costs can be reduced.

The sheet-shaped conductive foil 100 may be provided as a roll having a predetermined width, and may be conveyed to the individual steps that will be described later (see FIG. 14).

Following this, a process is performed for removing portions of the conductive foil 100, excluding those areas that will serve as conductive paths 102, to reduce its thickness.

Figure 15:
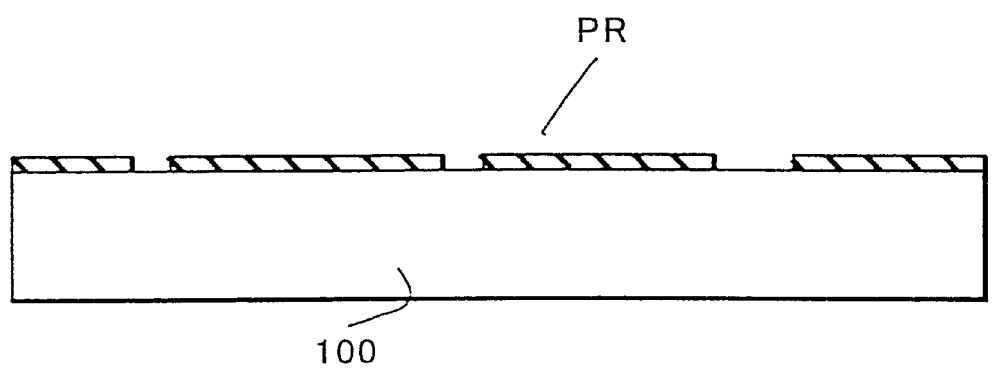
FIG. 15 is a diagram for explaining the method for manufacturing the semiconductor device of the invention.

First, a photoresist (anti-etching mask) PR is formed on the conductive foil 100, and is so patterned that except for those areas that will serve as the conductive paths 102 the surface of the conductive foil 100 is exposed (see FIG. 15).

Figure 16A:
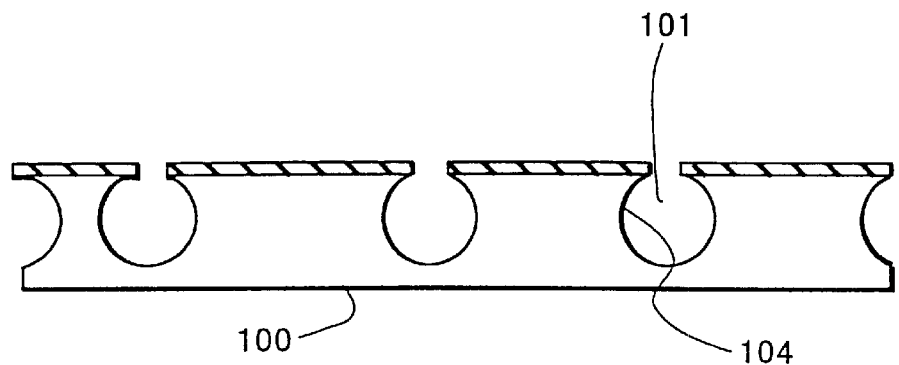
FIG. 16 is a diagram for explaining the method for manufacturing the semiconductor device of the invention.
Figure 16B:
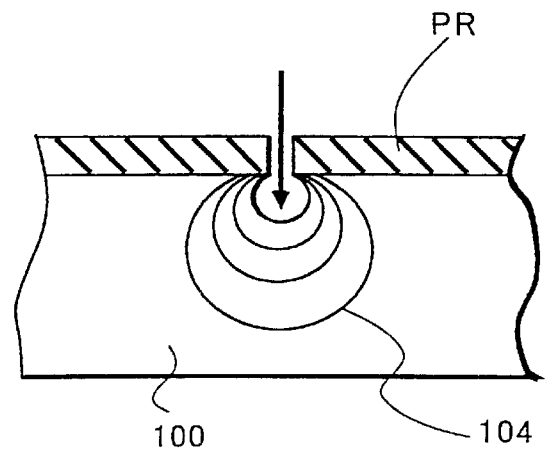
Figure 16C:
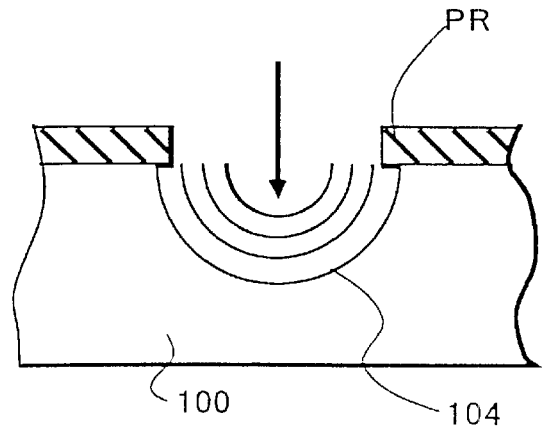

Then, as is shown in FIGS. 16A to 16C, the resultant structure need only be etched via the photoresist PR.

The depth of separation grooves 101 that are formed by etching is 50 $\mu$m, and since the etching process, or a surface roughening process, will produce rough side walls, the potential for obtaining a good bond with an insulating resin 103 is increased.

The structure of the side walls of the separation grooves 101 varies depending on the material removal method. For the removal process, wet etching, dry etching, evaporation using a laser, or dicing can be employed. The separation grooves 101 may also be formed by pressing. For wet etching, ferric chloride or cupric chloride are mainly employed as an etchant, and showering is performed using this etchant. Since wet etching is generally performed non-anisotropically, the side walls form curved structures, as is shown in FIGS. 16B and 16C. When in FIG. 16B an anti-etching mask that is superior in adhesion is selected or a material, such as Ni, is employed, an eave is formed. During this process, the conductive path itself serves as an eave, or an eave is provided, together with a conductive film that is deposited on the conductive path. Depending on the method used for forming an anti-etching mask, as is shown in FIG. 16C, a side wall can assume a semi-circular shape. Since the curved structure 104 is obtained in either case, anchoring effects can be provided.

Dry etching can be performed either anisotropically or non-anisotropically. While at the present, it is impossible to remove copper using reactive ion etching, the copper can be removed by sputtering. Further, depending on the sputtering condition, dry etching is performed anisotropically or non-anisotropically.

More recently, halide is used for performing the anisotropic etching to Cu in such a way that JP 3105547 discloses in its specification. According to the method, the introduced halogen basis is activated by the strongly-intensified light so that a non-masked portion is converted into a halide reaction product which might be evaporated by increasing temperature enough to do it or removed by cleaning it. Therefore, more precise patterning can be achieved in this invention by introducing this sort of method.

For evaporation using a laser beam, the separation grooves 101 can be formed by direct irradiation using the laser beam. In this case, the side walls of the separation grooves 101 that are formed are rather straight.

While an intricate pattern can not be formed by dicing, separation grooves having a grid shape can be formed.

Further, in FIGS. 16A to 16C, instead of the photoresist PR, a conductive film possessing anticorrosive properties that can resist the action of the etching liquid may be selectively deposited. When the conductive film is selectively formed on the portions that will serve as the conductive paths, it serves as an etching protection film, and the separation grooves can be formed without using the resist film. The material used for the conductive film can be Ni, Ag, Au, Pt or Pd. Furthermore, this anticorrosive conductive film can also be used unchanged as a die pad or a bonding pad.

The Ag film can be bonded to Au and also to the brazing material. Therefore, when the Au film is deposited on the back surface of the chip, the chip can be thermally attached to the Ag film on the conductive path 51, or can also be securely attached by using a brazing material, such as solder. In addition, since the fine Au line can be bonded to the Ag conducive film, the wire bonding is also enabled. Therefore, the conductive film can be used unchanged as the a pad or a bonding pad (see FIG. 16).

Figure 17:
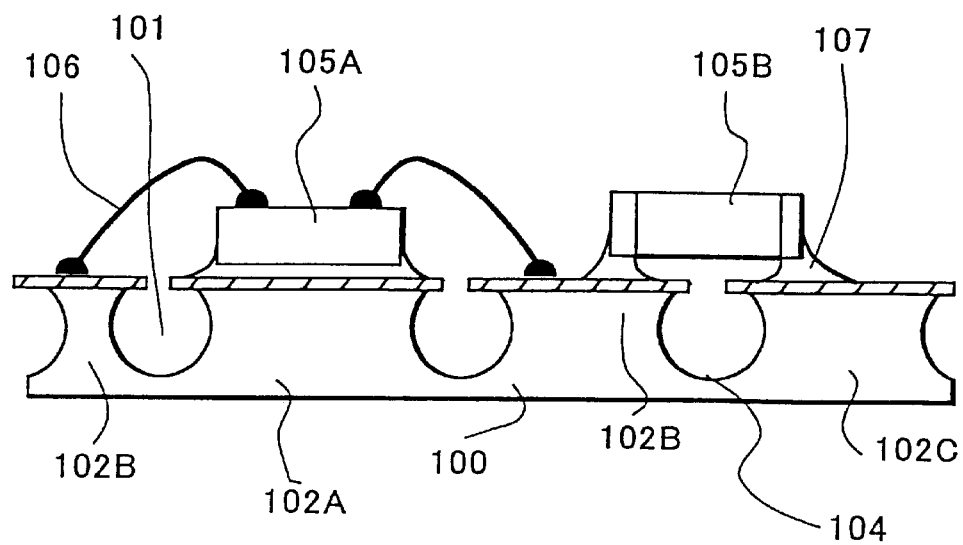
FIG. 17 is a diagram for explaining the method for manufacturing the semiconductor device of the invention.

Next, as is shown in FIG. 17, a process is performed for mounting, through electrical connection, circuit elements 105 on the conductive foil 100 in which the separation grooves 101 are formed.

As was explained while referring to FIGS. 1 to 13, the circuit elements 105 are a semiconductor element 105A, such as a transistor, a diode or an IC chip, and a passive element 105B, such as a chip capacitor or a chip resistor. Further, while the thickness of the structure is increased, a face-down semiconductor element, such as a CSP including a wafer scale CSP or a BGA semiconductor element, can be used.

Figure 18:
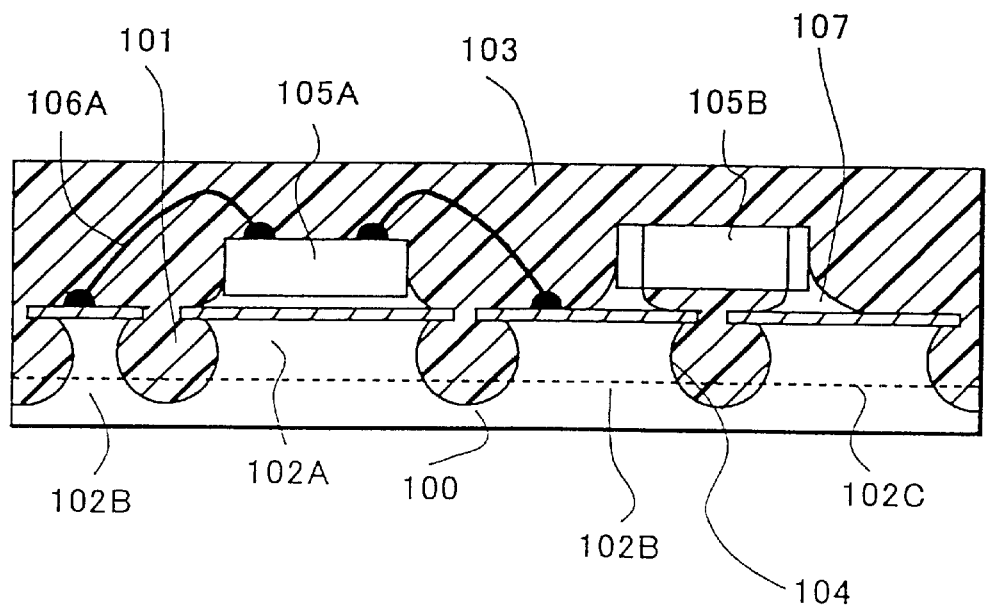
FIG. 18 is a diagram for explaining the method for manufacturing the semiconductor device of the invention.

In this embodiment, using die bonding, the transistor chip 105A is attached as a bare semiconductor chip to a conductive path 102A. The emitter electrode and the conductive path 102B, and the base electrode and the conductive path 102B, are connected together via fine metal lines 106 that are secured, using heat, by ball bonding, or by wedge bonding using an ultrasonic wave. Bonding of the passive element, such as a chip capacitor, and/or active element 105B (the chip capacitor in this embodiment) is performed using a brazing material, such as solder, or using conductive paste 107 (see FIG. 17):

Furthermore, as is shown in FIG. 18, a process is performed for attaching an insulating resin 103 to the conductive foil 100 and the separation groove 101. Transfer molding, injection molding or dipping can be employed for this process. As the resin material, a thermosetting resin, such as an epoxy resin, is appropriate for transfer molding, and a thermoplastic resin, such as a polyimido resin or polyphenylene sulfide, is appropriate for injection molding.

In this embodiment, insulating resin 103 having a thickness of about 100 µm, measured from the top of the circuit element, is deposited on the surface of the conducive foil 100. The thickness can be increased or reduced while taking the strength of the material into account.

According to the feature of this step, the conductive path 100 that serves as the conductive path 102 is used as a support substrate until the insulating resin 103 is formed. For a CSP using a printed circuit board or a flexible sheet, the conductive paths are formed by using a support substrate (printed circuit board or the flexible sheet) that originally is not required, while according to this invention, the conductive path 100 that serves as the support substrate is a necessary material as the conductive path. Therefore, for the process, the amount of component material required can be minimized, and manufacturing costs can be reduced.

Since the separation groove 101 is formed shallower than the thickness of the conductive foil 100, the conductive foil 100 is not divided into separate conductive paths 102. Therefore, performing the process from the mounting of the circuit element to the dicing, and especially, the molding, the conveying and the injection of the insulating resin into the dies, is very easy. Further, as previously mentioned, since an impurity is added to the conductive foil, the foil possesses more rigidity, and the usability is increased.

Following this, a process is performed for chemically and/or physically removing the back surface of the conductive foil 100 and for separating the conductive foil 100 into the conductive paths 102. For this removal, abrasion, grinding, etching or metal evaporation using a laser is employed.

Figure 21A:
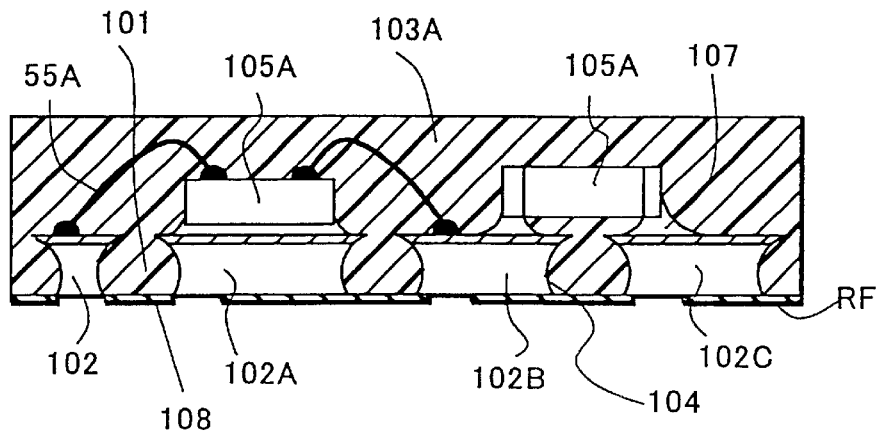
FIG. 21 is a diagram for explaining the method for manufacturing the semiconductor device of the invention.
Figure 21B:
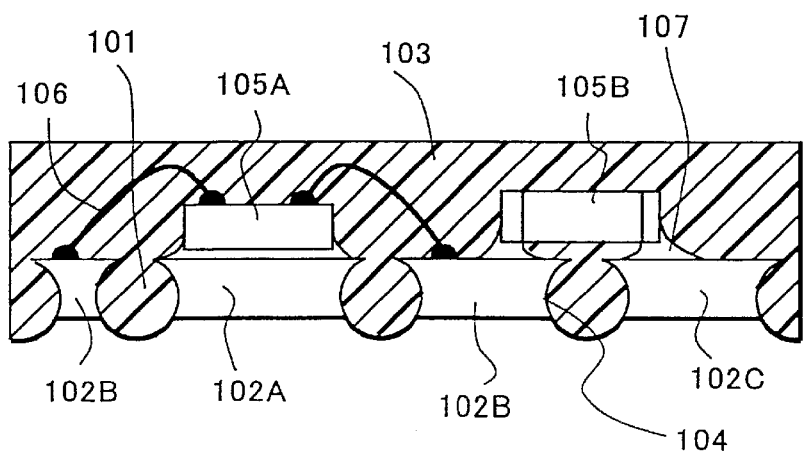
Figure 21C:
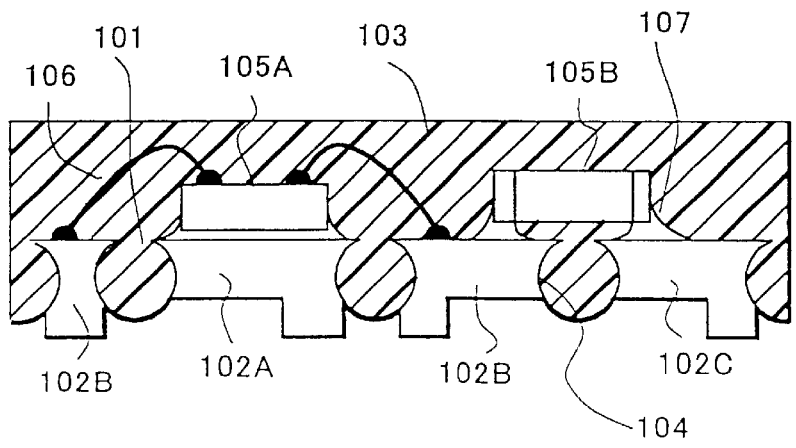

Semiconductor devices obtained using this separation method are shown in FIGS. 21A to 21C.

First, the semiconductor device in FIG. 21A is finally obtained by grinding the back surface to level off the back surface of the conductive path 102 and the back surface of the separation groove 101.

The semiconductor device shown in FIG. 21B is obtained by performing etching before the separation grooves 101 are exposed. Generally, since over-etching is performed in order to completely separate the conducive path 102, the conductive path 102 is recessed relative to the back surface of the separation groove 101.

The semiconductor device in FIG. 21C is obtained by performing an etching process to an anti-etching mask being formed on a part where the external connection electrodes are formed on the back surface of the conductive foil 100 at the step of FIG. 18. As a result, one part of the conductive path 102 projects outward from the back surface of the separation groove 101.

The exposed faces shown in FIGS. 21A and 21B are indicated by a broken line in FIG. 18.

Figure 19:
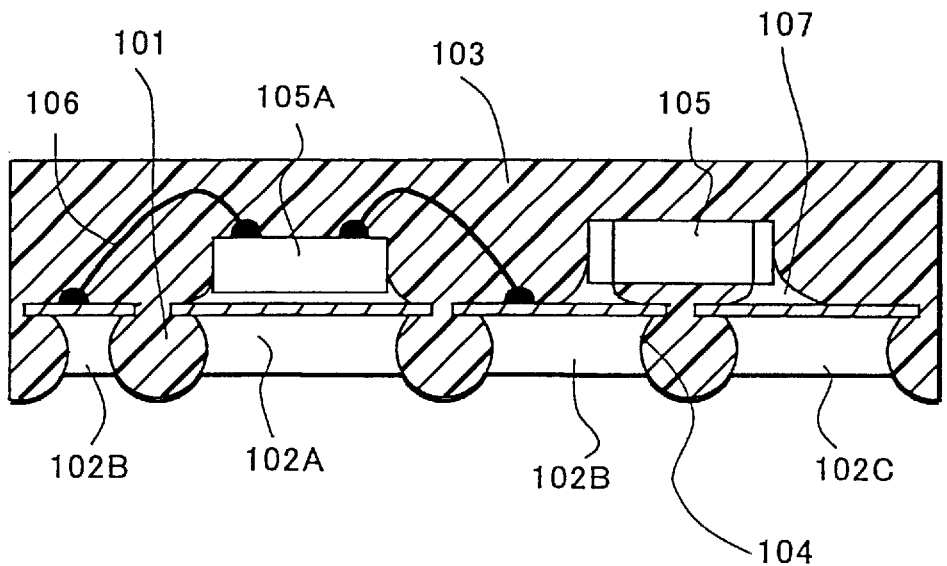
FIG. 19 is a diagram for explaining the method for manufacturing the semiconductor device of the invention.

FIG. 19 is a diagram showing an example semiconductor device wherein separate conductive paths 102 are obtained. It should be noted that wet etching is performed for the separation.

In addition, in order to prevent the short circuits with the wiring line of the substrate, an insulating film 108 is deposited on the back surface of the semiconductor device. A brazing material 109, such as solder, having an perfect semi-spherical shape is formed so that the brazing material does not wet the insulating film 108.

Figure 20:
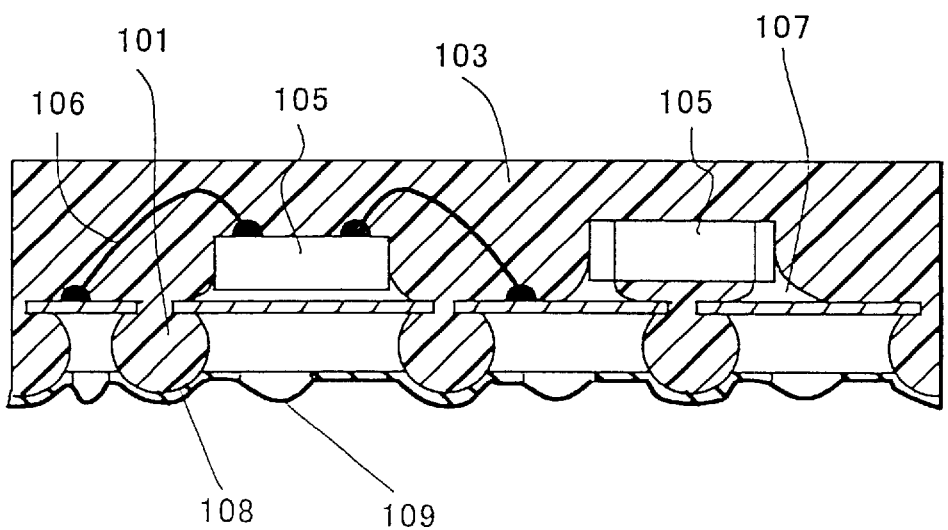
FIG. 20 is a diagram for explaining the method for manufacturing the semiconductor device of the invention.

As a result, conductive paths 102 about 40 μm thick are obtained (see FIG. 20).

A conductive film made of Au or Ag may be deposited on the back surface of the conductive path 102. In this case, the conductive film need only be formed in advance on the back surface of the conductive foil in FIGS. 14 to 17 using, for example, plating. A material that is resistant to etching is preferable for the conductive film.

According to the manufacturing method for this embodiment, the semiconductor chip and the chip capacitor are mounted on the conductive foil 100; however, multiple sets of these components may be arranged as a matrix. In this case, dicing is performed to separate the conductive foil 100 for each set.

As is apparent from the manufacturing method of the invention, various semiconductor devices can be manufactured: a discrete type or a BGA type, wherein one of a transistor, a diode, an IC or an LSI is mounted as an active element (semiconductor chip); a multi-chip type, wherein multiple active elements are mounted; and a hybrid IC type, wherein a transistor, a diode, an IC or an LSI is mounted as a passive element (semiconductor chip) while a chip resistor or a chip capacitor is mounted as a passive element, and wherein wiring lines are formed as conductive paths in order to implement a desired circuit.

According to the manufacturing method of the invention, a semiconductor device can be provided wherein the conductive paths 51 are embedded in the insulating resin, and the back surfaces of the paths 51 are exposed through the back surface of the insulating resin.

The manufacturing method of the invention includes a feature whereby the insulating resin can be used as a support substrate when forming separate conductive paths. The insulating resin is a required material for used for the embedding of the conductive paths, and an additional support substrate is not required. Therefore, only the minimum amount of material is required to manufacture the semiconductor device, and the manufacturing costs can be reduced.

As is apparent from the manufacturing method, using the conductive path separation method, recessed portions 93 can be formed on the back surface of the conductive path as is shown in FIG. 12A. Further, a package can be formed wherein the curve of the side wall of the conductive path matches the curve of the side wall of the separation groove. Then, since the bottom of the separation groove is anisotropically etched, an empty area 93A having a curved surface, indicated by a triangle, is formed.

Because of the curved faces of the separation grooves, even when melted solder is provided at the separation grooves, due to the surface tension of the solder, it flows as indicated by arrows along the inclination of the separation groove, and the separate island-like solder portions having semi-spherical shapes can be formed. Further, since the empty areas 93A are provided, a clearance area is formed for the solder, so that a phenomenon can be prevented whereby adjacent melted solder portions are coupled together and cause a short circuit.

In FIG. 12B, one part of the projected portion of the separation groove is flattened. As a result of etching, the depths of the separation grooves will vary depending on the interval between the conductive paths, and the heights of the projected portions will differ. In this case, the semiconductor device may not be arranged horizontally, and when the separate conductive paths are obtained, the back surface of the semiconductor device will be ground so to level off the heights of all the projected portions 91. The portion indicated by FL is a flattened portion.

FIG. 13 is a diagram showing the structure where the semiconductor device is mounted on a substrate 520. Since a circuit pattern 521 that is formed on the substrate is coupled with the conductive paths 522 that are connected to a semiconductor chip, the heat of the semiconductor chip can be discharged to the circuit pattern 521.

In FIG. 12, the height H indicates the distance how the top of the projected portion 91 is projected outward from the back surface of the conductive path. In this case, H is about 20 μm. The brazing material 94, such as solder, solidified on the back surface of the conductive path must have height that is greater than the projected portion 91. However, when the solder 94 is melted, it is lowered by the its own weight and external force, and the projected portion 91 that serves as the stopper contacts the substrate 520, as is shown in FIG. 13. Then, since the projected portion 91 is curved, and the friction coefficient of the back surface of the semiconductor device is small, the semiconductor device can be easily moved and self-alignment is also facilitated.

FIG. 22 is a diagram for explaining the reduction in the size of the semiconductor device of the invention when it is employed. Photos in FIG. 22 are provided at the same magnification rate, and represent, from left to right, a single SMD using a lead frame, a compound SMD using a lead frame and the semiconductor device of this invention. For the single SMD, one TR is molded and for the compound TR, two TRs are molded. The semiconductor device of this invention is the device where the circuit in FIG. 6 is mounted, and four TRs are sealed in it. As is apparent from FIG. 22, although twice the number of elements in the compound SMD are sealed in the semiconductor device of the invention, the device is only slightly larger than the compound SMD that includes the lead frame. It should be noted that the leftmost semiconductor device is the one in which only one TR is sealed. As is apparent from the drawing, a thin and compact semiconductor can be provided by this invention that would be the optimal choice for a portable electrode apparatus.

Figure 23:
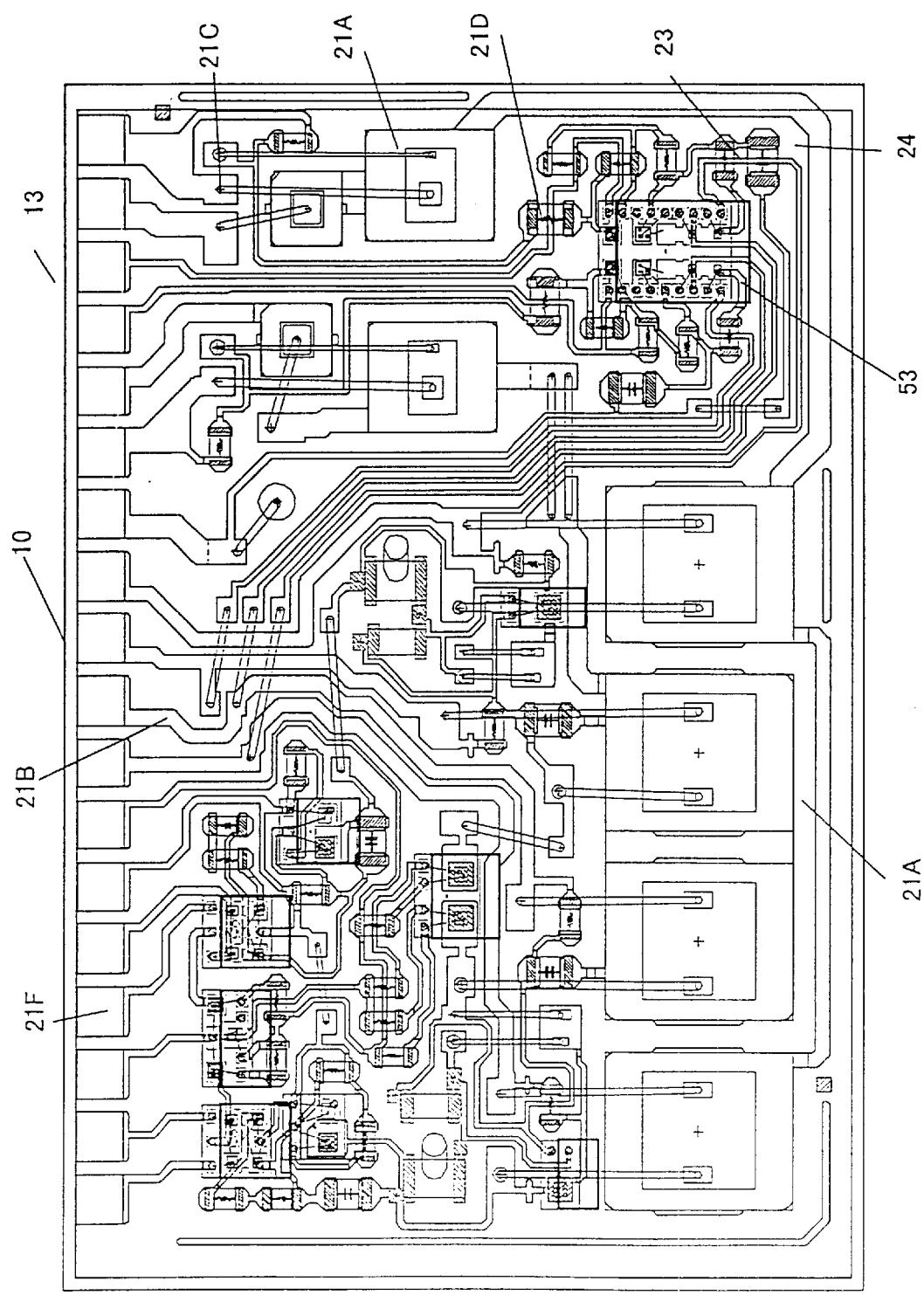
FIG. 23 is a diagram for explaining a hybrid integrated circuit substrate on which the semiconductor device of the invention is mounted.
Figure 25:
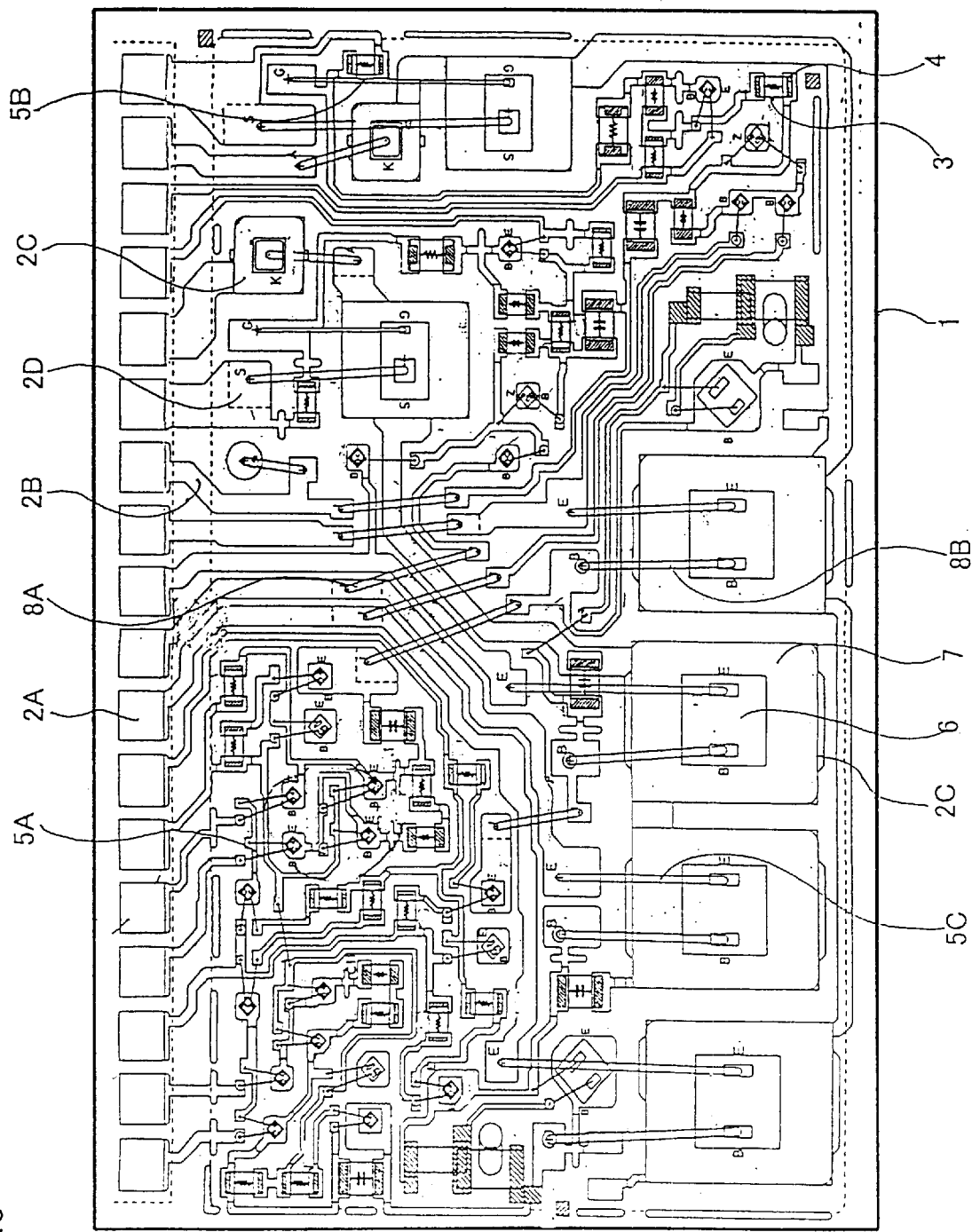
FIG. 25 is a diagram for explaining a conventional hybrid integrated circuit substrate using the circuit in FIG. 24.
Figure 26A:
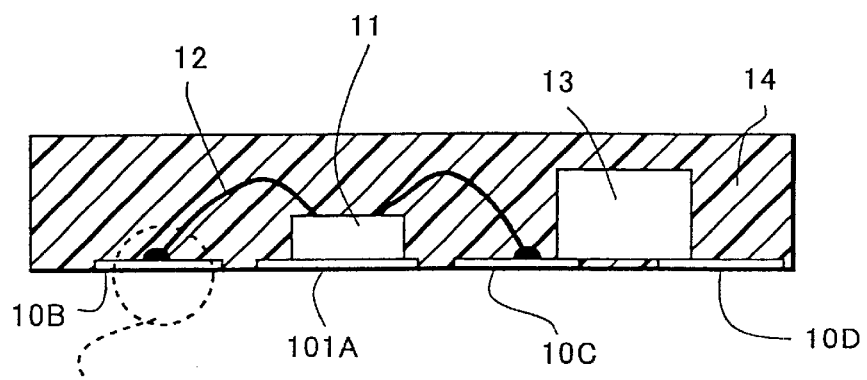
FIG. 26 is a diagram for explaining a conventional semiconductor device.
Figure 26B:
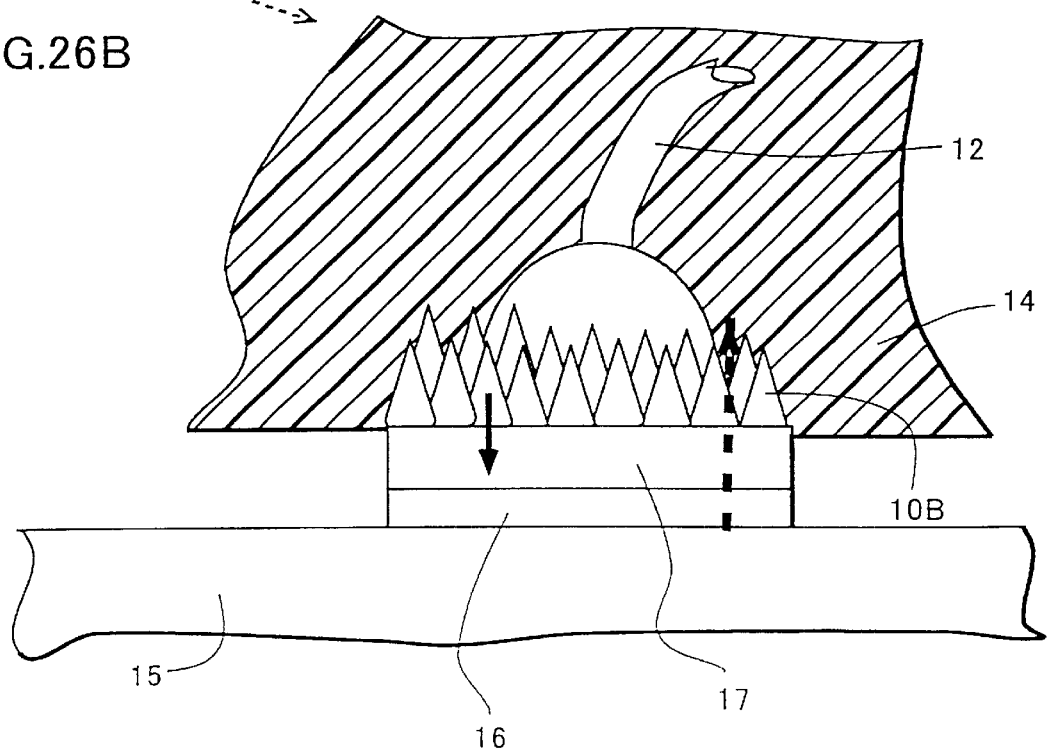

Finally, FIG. 23 is a diagram showing a substrate wherein the semiconductor device of the invention is mounted. This is obtained by reforming a circuit pattern and mounting it on the conventional substrate in FIG. 25. As is apparent from FIG. 23, the circuit pattern of the substrate is simplified and larger gaps are obtained between the components. This means that the circuit pattern of the substrate can be closely arranged and the substrate can be made more compactly. Further, the number of die bonding processes and the number of wire bonding processes required for the semiconductor chips are reduced, and accordingly, the number of steps needed to assemble the substrate was reduced considerably. Several types of fine metal lines are employed for the substrate. Assume that in FIG. 25 that 40 μm wide Au or Al lines are used for small signals and 150 μm and 300 μm wide AL lines are used for large signals. When the structure of this invention is employed for a semiconductor element that is connected to at least one of these three metal lines, the bonding of the metal lines is not required at all. Since the bonder mechanism greatly differs between the Au line and the Al line, these lines are connected by separate bonders. However, when the semiconductor element connected by the Au line is packaged with the structure of the invention, and when the Al line is used for the jumping portion that uses the Au line, the bonder for the Au line is not required for the assembly of the substrate. This contributes greatly to the simplification of the assembling processing.

Furthermore, in the conventional package for which the lead frame is used, a hang lead or a tie bar that is cut is always exposed on the side wall of the package. Therefore, to avoid the contact with the exposed portion, two packages are arranged so they do not contact each other. However, according to the invention, since a package, except for its back surface, is covered with insulating resin, in the substrate arrangement the semiconductor devices can contact each other.

Further, on the back surface of the semiconductor device, the projected portions made of the insulating resin draw a curve, and their surfaces have a very small friction coefficient. In addition, since the semiconductor device is thin and light, it is automatically self-aligning during soldering.

Moreover, when a metal substrate is employed, the heat of the semiconductor device can be discharged via the metal substrate, and a rise in the temperature of the entire substrate, considered as a module, can be prevented.

As is apparent from the description, according to the invention, a thin semiconductor device comprising several different types, a discrete type, a BGA type, a multi-chip type and a hybrid type, can be mounted. Further, as a countermeasure the prevent warping from damaging the thin semiconductor device, rolled X-Y film is employed as a conductive path, so that fractures of conductive paths due to the contraction of resin can be prevented. Further, since X-Y film is employed as an underlayer for the electrical connection portion used as the semiconductor device, contamination of the connection portion can be prevented, and a semiconductor device can be supplied to a used that is resistant to transient changes or failure after the structure has been packaged. Further, while stress tends to be applied to long wiring lines compared with other conductive paths, fracturing of the lines can be suppressed by using the X-Y film.

Furthermore, when the manufacturing method is employed, the back surface of the insulating resin and the side walls of the conductive paths form the same etching face. Specifically, the back surface of the insulating resin is curved, and an empty area is defined at the portion adjacent to the curved area. Thus, a clearance area can be formed for melted soldier, and the friction coefficient across the back surface of the semiconductor device can be reduced.

In addition, since the thermal process for the generation of an oxide film is performed for conductive foil that has been half-etched, Cu oxide is deposited on the surface. With this oxide film, the bonding property of the conductive foil and the insulating film can be improved.

What is claimed is:

1. A semiconductor device comprising:
   a plurality of conductive paths formed of a conductive material of which crystal growth of X and Y axes is larger than that of Z axis;
   a semiconductor chip electrically connected to said conductive paths; and
   an insulating resin which is coated onto said semiconductor chip and upper surfaces of said conductive paths, and filled into separation grooves between said conductive paths, said insulating resin integrally supporting said conductive paths of which back surfaces are exposed.

2. The semiconductor device according to claim 1, wherein a back surface of said insulating resin and side walls of said conductive paths are substantially on the same etching plane.

3. The semiconductor device according to claim 1, wherein a back surface of said insulating resin being filled into said separation grooves is convexly formed to be protruded from back surfaces of said conductive paths.

4. The semiconductor device according to claim 1, wherein an oxide of said conductive material is formed on each of the upper surfaces of said conductive paths which contact said insulating resin.

5. The semiconductor device according to claim 1, wherein said insulating film is substantially thinner than 1 mm, and said conductive paths are thick enough to be processed by a rolling method.

6. A semiconductor device comprising:
   a plurality of conductive paths formed of a first conductive material of which crystal growth of X and Y axes is larger than that of Z axis;
   a conductive film formed on upper surfaces of said conductive paths, which is formed of a second conductive material of which crystal growth of Z axis is larger than those X and Y axes;
   a semiconductor chip electrically connected to said conductive films; and
   an insulating resin which is coated onto said semiconductor chip and the upper surfaces of said conductive paths, and filled into separation grooves between said conductive paths, said insulating resin integrally supporting said conductive paths of which back surfaces are exposed.

7. A semiconductor device comprising:
   a plurality of conductive paths formed of a first conductive material of which crystal growth of X and Y axes is larger than that of Z axis;
   a conductive film formed on each upper surface of said conductive paths, which is formed of a second conductive material of which crystal growth of Z axis is larger than those X and Y axes
   a semiconductor chip electrically connected to said conductive paths; and
   an insulating resin which is coated onto said semiconductor chip and the upper surfaces of said conductive paths, and filled into separation grooves between said conductive paths, said insulating resin integrally supporting said conductive paths of which back surfaces are exposed
   wherein a back surface of said insulating resin and a side wall of said conductive paths are substantially on the same etching plane.

8. A semiconductor device comprising:
   a plurality of conductive paths formed of a first conductive material of which crystal growth of X and Y axes is larger than that of Z axis;
   a conductive film plated on upper surfaces of said conductive paths, which is formed of a second conductive material of which crystal growth of Z axis is larger than those X and Y axes
   a semiconductor chip electrically connected to said conductive paths; and
   an insulating resin which is coated onto said semiconductor chip and the upper surfaces of said conductive films, and filled into separation grooves between said conductive paths, said insulating resin integrally supporting said conductive paths of which back surfaces are expose,
   wherein etched side walls of said conductive paths are formed in curved shapes, said curved shapes being substantially same as shapes of at least a part of the back surfaceof said insulating resin.

9. The semiconductor device according to one of claims 6 to 8, wherein non-anisotropic etching is used to form said etched side walls.

10. The semiconductor device according to one of claims 6 to 8, wherein a back surface of said insulating resin being filled into said separation grooves is convexly formed to be protruded from back surfaces of said conductive paths.

11. The semiconductor device according to one of claims 6 to 8, wherein an oxide is formed on the upper surfaces of said conductive paths contacting said insulating resin.

12. The semiconductor device according to one of claims 6 to 8, wherein a conductive film is deposited on said back surfaces of said conductive paths.

13. The semiconductor device according to one of claims 6 to 8, wherein said conductive film can be provided by forming flanges on said upper surfaces of said conductive paths.

14. The semiconductor device according to one of claims 6 to 8, wherein said conductive paths that are exposed and free of said insulating resin are covered by an insulating film, except for portions at electrical connections.

15. The semiconductor device according to one of claims 6 to 8, wherein wire lines are provided as said conductive paths, and said conductive paths that are exposed and free of said insulating resin are covered by an insulating film, except for portions at electrical connections.

16. A semiconductor module comprising:
a plurality of conductive paths formed of a first conductive material of which crystal growth of X and Y axes is larger than that of Z axis;
a conductive film formed on upper surfaces of said conductive paths, which is formed of a second conductive material of which crystal growth of Z axis is larger than those X and Y axes;
a semiconductor chip electrically connected to said conductive films; and
an insulating resin which is coated onto said semiconductor chip and the upper surfaces of said conductive paths, and filled into separation grooves between said conductive paths, said insulating resin integrally supporting said conductive paths of which back surfaces are exposed
wherein said semiconductor device is mounted onto a substrate with an exposed portions of said back surfaces.

17. A semiconductor module comprising:
a plurality of conductive paths formed of a first conductive material of which crystal growth of X and Y axes is larger than that of Z axis;
a conductive film plated on each upper surface of said conductive paths, which is formed of a second conductive material of which crystal growth of Z axis is larger than those X and Y axes;
a semiconductor chip electrically connected to said conductive films; and
an insulating resin which is coated onto said semiconductor chip and the upper surfaces of said conductive paths, and filled into separation grooves between said conductive paths, said insulating resin integrally supporting said conductive paths of which back surfaces are expose, wherein
side walls of said conductive paths are formed in curved shapes, said curved shapes being substantially same as shapes of at least a part of the back surface of said insulating resin, further wherein
said semiconductor device is mounted on a substrate with an exposed portions of said back surfaces.

18. A semiconductor module comprising:
a plurality of conductive paths formed of a first conductive material of which crystal growth of X and Y axes is larger than that of Z axis;
a conductive film formed on upper surfaces of said conductive paths, which is formed of a second conductive material of which crystal growth of Z axis is larger than those X and Y axes
a semiconductor chip electrically connected to said conductive films; and
an insulating resin which is coated onto said semiconductor chip and the upper surfaces of said conductive paths, and filled into separation grooves between said conductive paths, said insulating resin integrally supporting said conductive paths of which back surfaces are exposed, wherein
side walls of said conductive paths are formed in curved shapes in which a back surface of said insulating resin and at least one of said side walls of said conductive paths are substantially on the same etching plane, further wherein
said semiconductor device is mounted on a substrate with an exposed portions of said back surfaces.

19. The semiconductor module according to one of claims 16 to 18, wherein said back surfaces of said conductive paths and said substrate are connected using brazing material, and a film for preventing the leakage of said brazing material is deposited on a connection pattern on said back surfaces of said conductive paths and/or on said substrate.

20. The semiconductor module according to one of claims 16 to 18, wherein said etched face is curved substantially the same as is a face formed by non-anisotropic etching.

21. The semiconductor module according to one of claims 16 to 18, wherein said back surfaces of said conductive paths are recessed from said back surface of said insulating resin.

22. The semiconductor module according to one of claims 16 to 18, wherein an oxide is formed on the upper surfaces of said conductive paths contacting said insulating resin.

23. The semiconductor module according to one of claims 16 to 18, wherein a conductive film is deposited on said back surfaces of said conductive paths.

24. The semiconductor module according to claim 23, wherein said conductive film forms a flange on said upper surfaces of said conductive paths.

* * * * *